United States Patent
Zhang et al.

(10) Patent No.: US 12,143,124 B2
(45) Date of Patent: Nov. 12, 2024

(54) ENCODING AND DECODING METHOD AND RELATED APPARATUS

(71) Applicant: Huawei Technologies Co., Ltd., Shenzhen (CN)

(72) Inventors: Huazi Zhang, Hangzhou (CN); Wen Tong, Ottawa (CA); Jun Wang, Hangzhou (CN); Rong Li, Hangzhou (CN); Jiajie Tong, Hangzhou (CN); Xianbin Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 18/366,757

(22) Filed: Aug. 8, 2023

(65) Prior Publication Data

US 2023/0387939 A1  Nov. 30, 2023

Related U.S. Application Data

(63) Continuation of application No. PCT/CN2022/074851, filed on Jan. 29, 2022.

(30) Foreign Application Priority Data

Feb. 9, 2021 (CN) .......................... 202110177405.2

(51) Int. Cl.
  *H03M 13/00* (2006.01)
  *H03M 13/11* (2006.01)

(52) U.S. Cl.
  CPC ...... *H03M 13/118* (2013.01); *H03M 13/1174* (2013.01)

(58) Field of Classification Search
  CPC .................... H03M 13/118; H03M 13/1174
  See application file for complete search history.

(56) References Cited

U.S. PATENT DOCUMENTS

| | | | |
|---|---|---|---|
| 2017/0257186 A1* | 9/2017 | Ge | H04L 1/0061 |
| 2019/0158128 A1 | 5/2019 | Ge et al. | |
| 2019/0349010 A1* | 11/2019 | Wu | H03M 13/1505 |
| 2021/0376857 A1* | 12/2021 | Montorsi | H03M 13/6527 |

\* cited by examiner

*Primary Examiner* — Christine T. Tu
(74) *Attorney, Agent, or Firm* — Slater Matsil, LLP

(57) ABSTRACT

A sending device may obtain a first to-be-encoded vector. The sending device may perform first encoding on the first to-be-encoded vector, to obtain a second to-be-encoded vector. The sending device may encode the second to-be-encoded vector based on a first generator matrix, to obtain an encoded codeword. The first generator matrix may include at least N+1 submatrices a, and N of the submatrices a may be located on a main diagonal of the first generator matrix. The first generator matrix may be a block upper triangular matrix, or the first generator matrix may be a block lower triangular matrix. The submatrix a is a polar kernel matrix with a size of $2^m \ast 2^m$, m is a natural number, and N is a natural number. The sending device may send the encoded codeword.

20 Claims, 26 Drawing Sheets

```
Sending device          Receiving device

Step 301: Obtain a first to-be-encoded vector

Step 302: Perform first encoding on the first
to-be-encoded vector, to obtain a second to-
          be-encoded vector Step 303: Perform second encoding on the second to-
be-encoded vector based on a first generator matrix,
       to obtain an encoded codeword ——— Step 304: The encoded codeword ——▶

Step 305: Decode the codeword
``` a b

———— Code length = 512, K = 64, long code (4 times the code length)

·············· Code length = 512, K = 64, triangular coupling

- - - - - - Code length = 512, K = 64, short code

Apparatus 1500

ENCODING AND DECODING METHOD AND RELATED APPARATUS

CROSS-REFERENCE TO RELATED APPLICATIONS

This application is a continuation of International Application No. PCT/CN2022/074851, filed on Jan. 29, 2022, which claims priority to Chinese Patent Application No. 202110177405.2, filed on Feb. 9, 2021. The disclosures of the aforementioned applications are hereby incorporated by reference in their entireties.

TECHNICAL FIELD

This application relates to the field of wireless communication technologies, and in particular, to an encoding and decoding method and a related apparatus.

BACKGROUND

In the field of communication technologies, a communication device (for example, a terminal device or a base station) may perform channel encoding and decoding by using a polar code.

In recent years, as the polar code is included in a 5th generation mobile network (5G) standard for wireless communication, decoding research on the polar code becomes a hot issue in the communication field. Currently, a mainstream polar code decoding method may be classified into two types based on a decoding time sequence of the polar code, namely, polar code sequential decoding and polar code non-sequential decoding. The polar code sequential decoding means that a decoder performs bit-by-bit decoding based on a natural time sequence designed for the polar code. The polar code non-sequential decoding means that a decoder outputs a decoding result in parallel based on another structure (such as a Tanner graph or a Trellis graph) of the polar code. An advantage of the polar code sequential decoding is being compatible with a polar code design, and convenient for theoretical analysis. A disadvantage is that, due to a bit-by-bit output feature of the polar code sequential decoding, a decoding delay is large, which is not suitable for a communication system having a high real-time requirement. The polar code non-sequential decoding is the opposite. Because a plurality of bits may be output at a time, a decoding delay is small. However, because the polar code non-sequential decoding does not completely match the polar code design, this may bring losses in decoding performance.

SUMMARY

Embodiments of this application provide an encoding and decoding method and a related apparatus, to reduce encoding and decoding complexity, obtain an encoding and decoding gain, and improve encoding and decoding performance.

According to a first aspect, an encoding method is provided. The method may be performed by a sending device, or may be performed by a chip having a function similar to that of the sending device. The sending device may be a terminal device or a network device. In this method, the sending device may obtain a first to-be-encoded vector. The sending device may perform first encoding on the first to-be-encoded vector, to obtain a second to-be-encoded vector. The sending device may encode the second to-be-encoded vector based on a first generator matrix, to obtain an encoded codeword. The first generator matrix may include at least N+1 submatrices a, and N of the submatrices a may be located on a main diagonal of the first generator matrix. The first generator matrix may be a block upper triangular matrix, or the first generator matrix may be a block lower triangular matrix. The submatrix a is a polar kernel matrix with a size of $2^m * 2^m$, m is a natural number, and N is a natural number. The sending device may send the encoded codeword.

Based on the foregoing solution, the sending device may perform first encoding on the first to-be-encoded vector. Because first encoding performed on any code block of the first to-be-encoded vector may be affected by a previous code block, and first encoding performed on a next code block may also be affected, a plurality of code blocks may be coupled, so as to obtain an encoding gain. In addition, when the second to-be-encoded vector is encoded by using the first generator matrix, because the first generator matrix includes the N+1 submatrices, the N+1 submatrices are located on the diagonal of the first generator matrix, and the first generator matrix is a block triangular matrix, it is equivalent to encoding a plurality of short codes, and then coupling the plurality of short codes to obtain an encoded codeword, to reduce encoding complexity and improve encoding performance.

In a possible implementation, upper triangular elements in the block upper triangular matrix are all a, and lower triangular elements in the block lower triangular matrix are all a.

Based on the foregoing solution, in the block upper triangular matrix, the upper triangular elements may all be a, lower triangular elements may be 0; and in the block lower triangular matrix, the lower triangular elements may all be a, and upper triangular elements may all be 0. When the second to-be-encoded vector is encoded, the plurality of short codes may be coupled based on a location relationship of the submatrices a in the first generator matrix.

In a possible implementation, the first generator matrix may include K first subblocks, the K first subblocks may be located on the main diagonal of the first generator matrix, adjacent first subblocks partially overlap, K is an integer greater than or equal to 2 and greater than or equal to N, and each of the first subblocks is $$\begin{bmatrix} a & 0 \\ a & a \end{bmatrix} \text{ or } \begin{bmatrix} a & a \\ 0 & a \end{bmatrix}.$$

Based on the foregoing solution, the first generator matrix may include K first subblocks located on the main diagonal of the first generator matrix, and the first subblock has two matrixes with different styles, so that the first generator matrix is also in two different styles. Therefore, different short codes can be coupled.

In a possible implementation, an overlapping portion between the adjacent first subblocks is a.

Based on the foregoing solution, a size of the overlapping portion between the adjacent first subblocks may be a size of the submatrix a, so that a coupling manner between short codes is related to a polar kernel matrix, to reduce encoding complexity.

In a possible implementation, the K first subblocks may include the N submatrices a, and when the first subblock is $$\begin{bmatrix} a & 0 \\ a & a \end{bmatrix},$$

one of the submatrices a is located in an upper right corner of the first generator matrix.

Based on the foregoing solution, the first generator matrix may include K first subblocks located on the main diagonal of the first generator matrix and one submatrix a located in an upper right corner, so that a first code block and a last code block in the second to-be-encoded vector are coupled, thereby further improving the encoding performance.

In a possible implementation, the K first subblocks may include the N submatrices a, and when the first subblock is $$\begin{bmatrix} a & a \\ 0 & a \end{bmatrix},$$

one of the submatrices a is located in a lower left corner of the first generator matrix.

Based on the foregoing solution, the first generator matrix may include K first subblocks located on the main diagonal of the first generator matrix and one submatrix a located in a lower left corner, so that a first code block and a last code block in the second to-be-encoded vector are coupled, thereby further improving the encoding performance.

In a possible implementation, the sending device may determine a quantity of second subblocks included in a to-be-encoded information bit. The sending device may determine, based on an overall code rate of the codeword and the quantity of second subblocks, a code rate of each second subblock included in the to-be-encoded information bit, where the second subblocks have different code rates. The sending device may determine the first to-be-encoded vector based on the code rate of each second subblock. The first to-be-encoded vector may include q second subblocks, and q is an integer greater than 0.

Based on the foregoing solution, when obtaining the first to-be-encoded vector, the sending device may determine the code rate of each second subblock in the first to-be-encoded vector based on the overall code rate of the codeword and the quantity of second subblocks, so that lengths of short codes are different, and lengths of coupling codes are also different, thereby improving the encoding performance.

According to a second aspect, a decoding method is provided. The method may be performed by a receiving device, or may be performed by a chip having a function similar to that of the receiving device. In this method, the receiving device may receive a codeword. The codeword may be obtained by encoding based on a first generator matrix. The first generator matrix may include at least N+1 submatrices a, N of the submatrices a may be located on a main diagonal of the first generator matrix, and the first generator matrix may be a block upper triangular matrix, or the first generator matrix may be a block lower triangular matrix. a is a polar kernel matrix with a size of $2^m*2^m$, m is a natural number, and N is a natural number. The receiving device may decode the codeword.

In a possible implementation, upper triangular elements in the block upper triangular matrix are all a, and lower triangular elements in the block lower triangular matrix are all a.

In a possible implementation, the first generator matrix may include K first subblocks, the K first subblocks may be located on the main diagonal of the first generator matrix, adjacent first subblocks partially overlap, and K is an integer greater than or equal to 2 and greater than or equal to N. Each of the first subblocks may be $$\begin{bmatrix} a & 0 \\ a & a \end{bmatrix} \text{ or } \begin{bmatrix} a & a \\ 0 & a \end{bmatrix}.$$

In a possible implementation, an overlapping portion between the adjacent first subblocks may be a.

In a possible implementation, the K first subblocks may include the N submatrices a, and when the first subblock is $$\begin{bmatrix} a & 0 \\ a & a \end{bmatrix},$$

one of the submatrices a is located in an upper right corner of the first generator matrix.

In a possible implementation, the K first subblocks may include the N submatrices a, and when the first subblock is $$\begin{bmatrix} a & a \\ 0 & a \end{bmatrix},$$

one of the submatrices a is located in a lower left corner of the first generator matrix.

According to a third aspect, a communication apparatus is provided. The apparatus may include modules/units configured to perform the first aspect or any possible implementation of the first aspect, or may further include modules/units configured to perform the second aspect or any possible implementation of the second aspect, for example, a processing unit and an input/output unit.

For example, when the apparatus includes the modules/units configured to perform the first aspect or any possible implementation of the first aspect, the processing unit is configured to obtain a first to-be-encoded vector; the processing unit is further configured to: perform first encoding on the first to-be-encoded vector to obtain a second to-be-encoded vector; and perform second encoding on the second to-be-encoded vector based on a first generator matrix, to obtain an encoded codeword, where the first generator matrix includes at least N+1 submatrices a, N of the submatrices a are located on a main diagonal of the first generator matrix, and the first generator matrix is a block upper triangular matrix, or the first generator matrix is a block lower triangular matrix, where a is a polar kernel matrix with a size of $2^m*2^m$, m is a natural number, and N is a natural number; and the input/output unit is configured to send the encoded codeword.

In a possible implementation, upper triangular elements in the block upper triangular matrix are all a, and lower triangular elements in the block lower triangular matrix are all a.

In a possible implementation, the first generator matrix includes K first subblocks, the K first subblocks are located on the main diagonal of the first generator matrix, adjacent first subblocks partially overlap, K is an integer greater than or equal to 2 and greater than or equal to N, and each of the first subblocks is $$\begin{bmatrix} a & 0 \\ a & a \end{bmatrix} \text{ or } \begin{bmatrix} a & a \\ 0 & a \end{bmatrix}.$$

In a possible implementation, an overlapping portion between the adjacent first subblocks is a.

In a possible implementation, the K first subblocks include the N submatrices a, and when the first subblock is $$\begin{bmatrix} a & 0 \\ a & a \end{bmatrix},$$

one of the submatrices a is located in an upper right corner of the first generator matrix.

In a possible implementation, the K first subblocks include the N submatrices a, and when the first subblock is $$\begin{bmatrix} a & a \\ 0 & a \end{bmatrix},$$

one of the submatrices a is located in a lower left corner of the first generator matrix.

In a possible implementation, the processing unit is further configured to: determine a quantity of second subblocks included in a to-be-encoded information bit; determine, based on an overall code rate of the codeword and the quantity of second subblocks, a code rate of each second subblock included in the to-be-encoded information bit, where the second subblocks have different code rates; and determine the first to-be-encoded vector based on the code rate of each second subblock, where the first to-be-encoded vector includes q second subblocks, and q is an integer greater than 0.

For example, when the apparatus includes modules/units configured to perform the second aspect or any possible implementation of the second aspect, the input/output unit is configured to receive a codeword, where the codeword is obtained by encoding based on a first generator matrix; and the processing unit is configured to decode the codeword based on the first generator matrix. The first generator matrix includes at least N+1 submatrices a, N of the submatrices a are located on a main diagonal of the first generator matrix, and the first generator matrix is a block upper triangular matrix, or the first generator matrix is a block lower triangular matrix, where a is a polar kernel matrix with a size of $2^m * 2^m$, m is a natural number, and N is a natural number.

In a possible implementation, upper triangular elements in the block upper triangular matrix are all a, and lower triangular elements in the block lower triangular matrix are all a.

In a possible implementation, the first generator matrix includes K first subblocks, the K first subblocks are located on the main diagonal of the first generator matrix, adjacent first subblocks partially overlap, K is an integer greater than or equal to 2 and greater than or equal to N, and each of the first subblocks is $$\begin{bmatrix} a & 0 \\ a & a \end{bmatrix} \text{ or } \begin{bmatrix} a & a \\ 0 & a \end{bmatrix}.$$

In a possible implementation, an overlapping portion between the adjacent first subblocks is a.

In a possible implementation, the K first subblocks include the N submatrices a, and when the first subblock is $$\begin{bmatrix} a & 0 \\ a & a \end{bmatrix},$$

one of the submatrices a is located in an upper right corner of the first generator matrix.

In a possible implementation, the K first subblocks include the N submatrices a, and when the first subblock is $$\begin{bmatrix} a & a \\ 0 & a \end{bmatrix},$$

one of the submatrices a is located in a lower left corner of the first generator matrix.

According to a fourth aspect, a communication apparatus is provided. The communication apparatus includes a processor and a transceiver. The transceiver performs sending and receiving steps of the method in the first aspect or any possible implementation of the first aspect, or performs sending and receiving steps of the method in the second aspect or any possible implementation of the second aspect. When a controller runs, the processor performs, by using a hardware resource in the controller, a processing step other than the sending and receiving steps of the method in the first aspect or any possible implementation of the first aspect, or performs a processing step other than the sending and receiving steps of the method in the second aspect or any possible implementation of the second aspect.

In a possible implementation, the communication apparatus further includes a memory. The memory may be located inside the apparatus, or may be located outside the apparatus and connected to the apparatus.

In a possible implementation, the memory may be integrated with the processor.

According to a fifth aspect, a chip is provided. The chip includes a logic circuit and a communication interface.

In a design, the logic circuit is configured to: obtain a first to-be-encoded vector, and perform first encoding on the first to-be-encoded vector, to obtain a second to-be-encoded vector; and perform second encoding on the second to-be-encoded vector based on a first generator matrix, to obtain an encoded codeword. The communication interface is configured to output the encoded codeword.

In a design, the communication interface is configured to input the encoded codeword. The logic circuit is configured to decode the encoded codeword based on the first generator matrix.

According to a sixth aspect, this application provides a computer-readable storage medium. The computer-readable storage medium stores instructions, and when the instructions are run on a computer, the computer is enabled to perform the method according to the foregoing aspects.

According to a seventh aspect, this application provides a computer program product storing instructions, and when the instructions are run on a computer, the computer is enabled to perform the method according to the foregoing aspects.

According to an eighth aspect, this application provides a communication system, including at least one terminal device and at least one network device described above.

In addition, for beneficial effects of the second aspect to the eighth aspect, refer to the beneficial effects shown in the first aspect.

DETAILED DESCRIPTION OF ILLUSTRATIVE EMBODIMENTS

In the field of communication technologies, a communication device (for example, a terminal device or a base station) may perform channel encoding by using a polar code. The following describes polar encoding in the following two manners.

Manner 1: a to-be-Encoded Bit is Encoded by Using a Generator Matrix.

Figure 1:
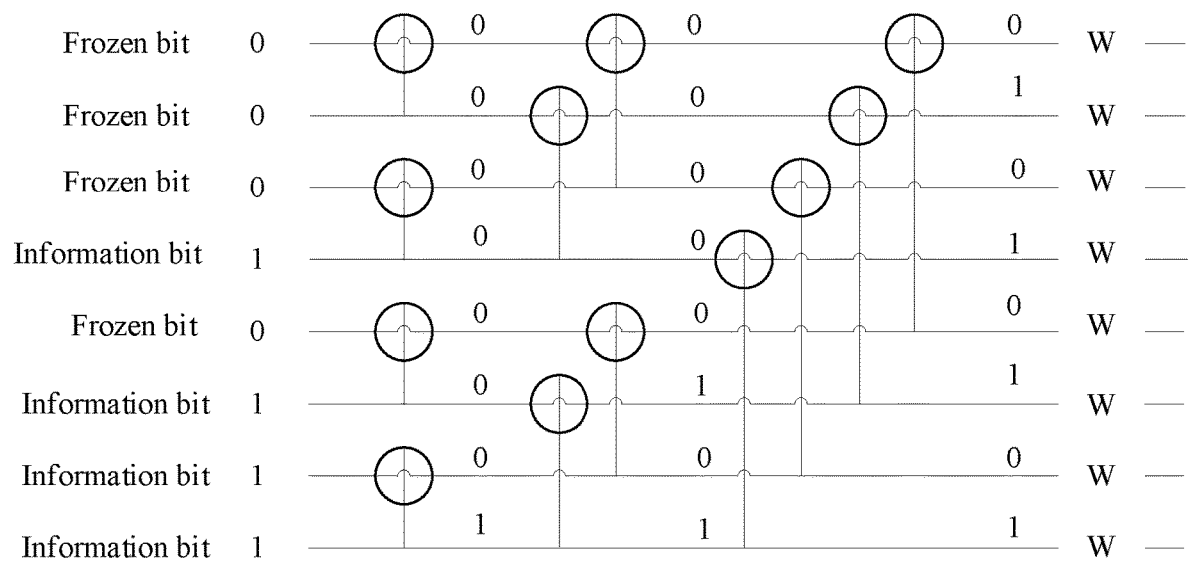
FIG. 1 is a schematic diagram of polar encoding.

$x_1^N = u_1^N G_N$. Refer to FIG. 1. $u_1^N$ is a row vector, $u_1^N = (u_1, u_2, \ldots, u_N)$, N is a code length, and N is an integer greater than or equal to 1. $u_i$ is an unencoded bit, and i is an integer between 1 and N. $u_1^N$ includes an information bit and/or a frozen bit, that is, $u_i$ may be an information bit or a frozen bit. The information bit is a bit used to carry information. The frozen bit is a filling bit, and the frozen bit may be usually 0.

$G_N$ is a generator matrix, $G_N$ is an N*N matrix, $G_N = B_N F_2^{\otimes(log_2(N))}$, or $G_N = F_2^{\otimes(log_2(N))}$. $B_N$ is an N*N reversal matrix, for example, $B_N$ may be a bit reversal matrix.

$$F_2 = \begin{bmatrix} 1 & 0 \\ 1 & 1 \end{bmatrix}$$

and $F_2^{\otimes(log_2(N))}$ is a kronecker product of $log_2(N)$ matrixes $F_2$. Both addition and multiplication above are operations in the binary Galois field. $G_N$ may also be referred to as a generator matrix kernel.

Manner 2: a Polar Encoding Process is Described by Using a Schematic Encoding Diagram.

Refer to FIG. 1. An encoding code length corresponding to the encoding diagram is 8, each circle in each row represents a sum between a bit in a row in which the circle is located and a row reached by the circle, and a bit on the right of the circle is a sum result. For example, a first circle in a row in which a first frozen bit is located is a sum of a frozen bit 0 in the row in which the circle is located, that is, a first row, and a bit 0 in the row reached by the circle, that is, a second row, and a sum result is 0.

Currently, because polar encoding can be strictly proved to be a channel encoding scheme that reaches a channel capacity, and has features such as high performance, low complexity, and a flexible matching manner, the polar encoding has been currently determined as a 5G control channel enhanced mobile broadband (eMBB) scene control channel encoding scheme by the 3$^{rd}$ generation partnership project (3GPP). Currently, a mainstream polar code decoding method may be classified into two types based on a decoding time sequence of the polar code, that is, polar code sequential decoding and polar code non-sequential decoding. The polar code sequential decoding means that a decoder performs bit-by-bit decoding based on a natural time sequence designed for the polar code. The polar code non-sequential decoding means that a decoder outputs a decoding result in parallel based on another structure (such as a Tanner graph or a Trellis graph) of the polar code. Currently, main polar code sequential decoding algorithms include successive cancellation (SC) decoding, successive cancellation list (SCL) decoding, successive cancellation stack (SCS) decoding, cyclic redundancy check-aided successive cancellation list (CA-SCL) decoding, and the like. While non-sequential decoding methods mainly include belief propagation (BP) decoding, and the like. In terms of decoding performance, the SC decoding is the worst, but a decoding delay of the SC decoding is improved. Decoding performance of the BP decoding is slightly better than that of the SC decoding. Decoding performance of the SCL decoding is greatly improved compared with that of the former, and the CA-SCL decoding can enable performance of the polar code to be better than that of a low-density parity-check code (LDPC) and a turbo code. Therefore, currently, the SCL decoding and the CA-SCL decoding are mainly used in an actual system.

An advantage of the polar code sequential decoding is being compatible with a polar code design, and convenient for theoretical analysis. A disadvantage is that, due to a bit-by-bit output feature of the polar code sequential decoding, a decoding delay is large, which is not suitable for a communication system having a high real-time requirement. The polar code non-sequential decoding is the opposite. Because a plurality of bits may be output at a time, a decoding delay is small. However, because the polar code non-sequential decoding does not completely match the polar code design, this may bring losses in decoding performance. However, through reasonable design, the losses can be minimized.

In view of this, embodiments of this application provide an encoding and decoding method, to reduce polar encoding and decoding complexity and improve polar encoding and decoding performance. Embodiments of this application provide a plurality of generator matrixes to encode to-be-encoded bits. In the foregoing plurality of generator matrixes, adjacent code blocks may be coupled, and short codes are coupled to a long code, so that decoding with low complexity is maintained while an encoding gain is increased.

Embodiments of this application may be applied to various fields in which polar encoding is used, for example, a data storage field, an optical network communication field, and a wireless communication field. The foregoing wireless communication field may include but is not limited to a 5G communication system, a future communication system (such as a 6G communication system), a satellite communication system, a narrow band-Internet of things (NB-IoT) system, a global system for mobile communication (GSM), an enhanced data rate for GSM evolution (EDGE) system, a wideband code division multiple access (WCDMA) system, a code division multiple access 2000 (CDMA 2000) system, a time division-synchronization code division multiple access (TD-SCDMA) system, a long term evolution (LTE) system, and three application scenarios of a 5G mobile communication system: eMBB, ultra-reliable and low latency communication (URLLC), and massive machine-type communication (mMTC).

Figure 2:
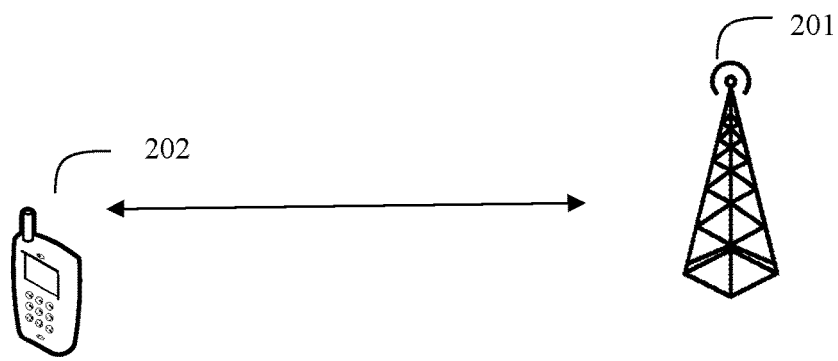
FIG. 2 is a schematic diagram of a communication system according to an embodiment of this application.

With reference to FIG. 2, the following describes a communication system to which the encoding and decoding method provided in embodiments of this application are applicable. Refer to FIG. 2. A communication system 200 includes a sending device 201 and a receiving device 202. The sending device 201 may be a network device or a terminal device, and the receiving device 202 may be a network device or a terminal device. Optionally, when the sending device 201 is a network device, the receiving device 202 may be a terminal device; or when the receiving device 202 is a network device, the sending device 201 may be a terminal device.

The sending device 201 may include an encoder, and the sending device 201 may perform polar encoding on a to-be-encoded bit by using the encoder, and output an encoded codeword. After rate matching, interleaving, and modulation, the encoded codeword may be transmitted to the receiving device 202 on a channel. The receiving device 202 may include a decoder. The receiving device 202 may receive and demodulate a signal from the sending device 201, and the receiving device 202 may decode a received signal by using the decoder.

The terminal device in this application includes a device that provides a voice and/or data connectivity for a user. Specifically, the terminal device includes a device that provides a voice for the user, includes a device that provides data connectivity for the user, or includes a device that provides a voice and data connectivity for the user. For example, the terminal device may include a handheld device having a wireless connection function, or a processing device connected to a wireless modem. The terminal device may include user equipment (UE), a wireless terminal device, a mobile terminal device, a device-to-device (D2D) communication terminal device, a vehicle to everything (V2X) terminal device, a machine-to-machine/machine-type communication (M2M/MTC) terminal device, an Internet of things (IoT) terminal device, a subscriber unit, a subscriber station, a mobile station, a remote station), an access point (AP), a remote terminal, an access terminal device, a user terminal device, a user agent, a user device, a satellite, a drone, a balloon, an airplane, and the like. For example, the terminal device may include a mobile phone (or referred to as a "cellular" phone), a computer with a mobile terminal device, or a portable, pocket-sized, handheld, or computer built-in mobile apparatus. For example, it may be a device such as a personal communication service (PCS) telephone, a cordless telephone, a session initiation protocol (SIP) phone, a wireless local loop (WLL) station, or a personal digital assistant (PDA). The terminal device further includes a limited device, for example, a device with low power consumption, a device with a limited storage capacity, or a device with a limited computing capability. For example, the terminal device includes an information sensing device such as a barcode, radio frequency identification (RFID), a sensor, a global positioning system (GPS), or a laser scanner. As an example instead of a limitation, in embodiments of this application, the terminal device may alternatively be a wearable device. The wearable device may also be referred to as a wearable intelligent device, an intelligent wearable device, or the like, and is a general term of wearable devices that are developed by using a wearable technology to intelligently design daily wearables. If the various terminal devices described above are located in a vehicle (for example, placed in the vehicle or installed in the vehicle), the terminal devices may be all considered as on-board terminal devices. For example, an on-board terminal device is also referred to as an on-board unit (OBU).

The network device in this application includes, for example, an access network (AN) device such as a base station (for example, an access point), and may be a device that is in an access network and that communicates with a wireless terminal device over an air interface through one or more cells. Alternatively, the network device is, for example, a road side unit (RSU) in a vehicle-to-everything (V2X) technology. The network device may include an evolved NodeB (NodeB, eNB, or e-NodeB, evolved NodeB) in a long term evolution (LTE) system or a long term evolution-advanced (LTE-A) system, may include an evolved packet core (EPC) network, the 5th (5G) generation mobile communication technology, a next generation NodeB (gNB) in a new radio (NR) system (also referred to as an NR system for short), or may include a central unit (CU) and a distributed unit (DU) in a cloud radio access network (Cloud RAN)

system, a satellite, a drone, a balloon, an airplane, and the like. This is not limited in embodiments of this application.

Figure 3:
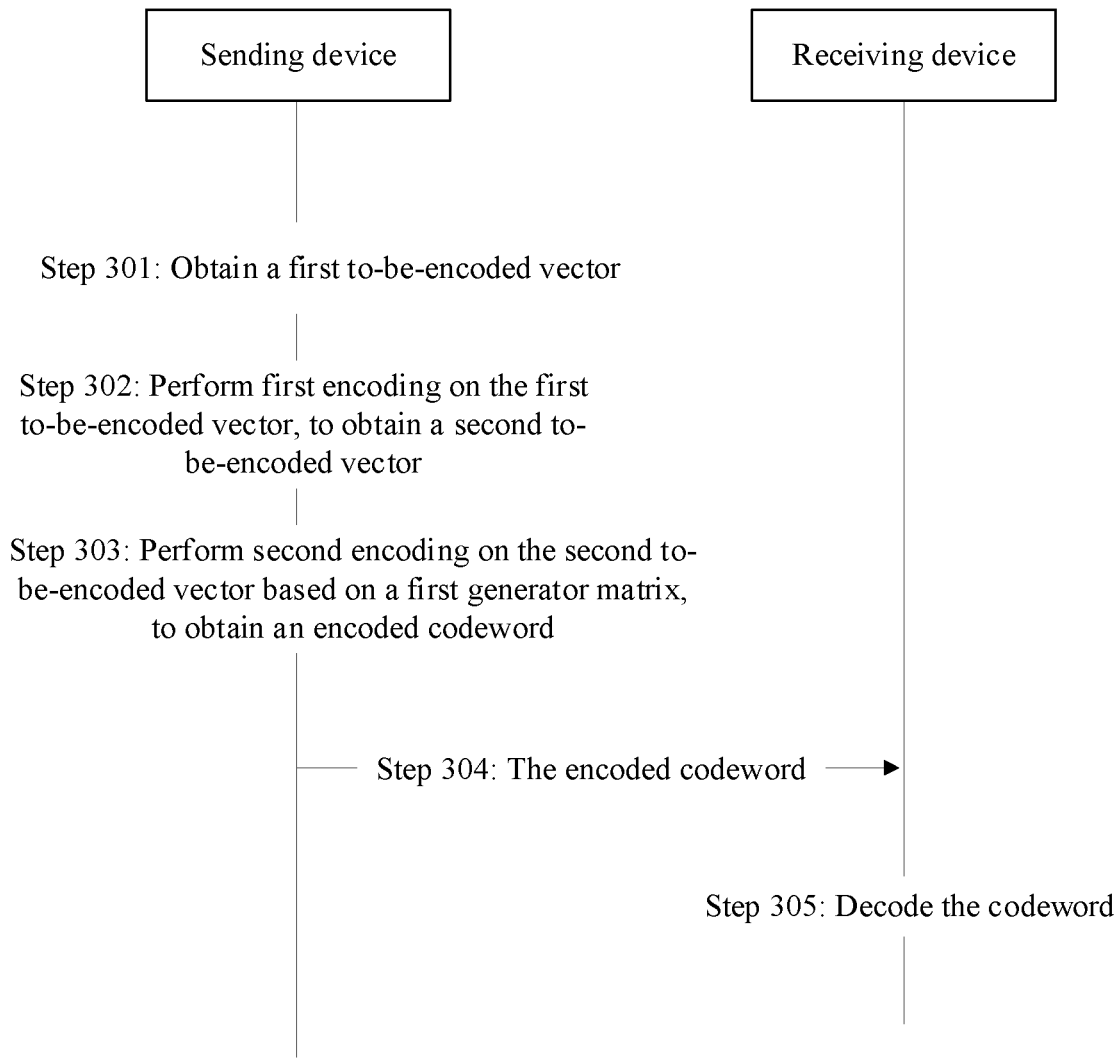
FIG. 3 is an example flowchart of an encoding method and a decoding method according to an embodiment of this application.

FIG. 3 is an example flowchart of an encoding and decoding method according to an embodiment of this application. The method may include the following steps.

Step 301: A sending device obtains a first to-be-encoded vector.

The first to-be-encoded vector may include an information bit and a frozen bit. The sending device may determine locations of Y to-be-encoded bits based on reliability of Y subchannels corresponding to the Y to-be-encoded bits, and then determine the first to-be-encoded vector. The sending device may select, from a plurality of subchannels corresponding to the Y to-be-encoded bits, locations corresponding to Y subchannels with highest reliability. After the locations of the Y subchannels are determined, to-be-encoded bits are filled in the locations of the Y subchannels as information bits, and frozen bits are filled in other locations, to obtain the first to-be-encoded vector. The first to-be-encoded vector may include Y' bits, and the Y' bits may include Y information bits and Y'-Y frozen bits. Y is a positive integer and is less than or equal to Y', and Y' is a positive integer.

For example, it is assumed that the encoding length is 8, and a quantity of to-be-encoded bits is 4. It is assumed that subchannels with highest reliability in 8 subchannels are respectively a subchannel 3, a subchannel 5, a subchannel 7, and a subchannel 8. In this case, locations corresponding to the subchannel 3, the subchannel 4, the subchannel 7, and the subchannel 8 are used to carry information bits, and other subchannels are used to carry frozen bits. In this case, a to-be-encoded sequence may be 00101011, where 1 represents an information bit, and 0 represents a frozen bit.

Step 302: The sending device performs first encoding on the first to-be-encoded vector, to obtain a second to-be-encoded vector.

The first encoding herein may include outer-code encoding. In a broad sense, the outer-code encoding may be represented as multiplying the first to-be-encoded vector by an upper triangular matrix, where values in a diagonal of the upper triangular matrix are all 1, a value in an upper right corner of the diagonal may be any value, and values in a lower left corner of the diagonal are all 0. This unified outer code is referred to as pre-transformation encoding. Specifically, the sending device may perform outer-code encoding on the first to-be-encoded vector by using convolutional codes (CC), parity check (PC), generalized cyclic redundancy check (generalized CRC), or other block codes. The sending device may perform outer-code encoding on the first to-be-encoded vector by using the information bit and the frozen bit of the first to-be-encoded vector through corresponding shift registers respectively. The following uses a polynomial 0×25 of the shift register as an example to describe different block codes.

1. Outer-Code Encoding by Using Convolutional Codes (CC).

Figure 4A:
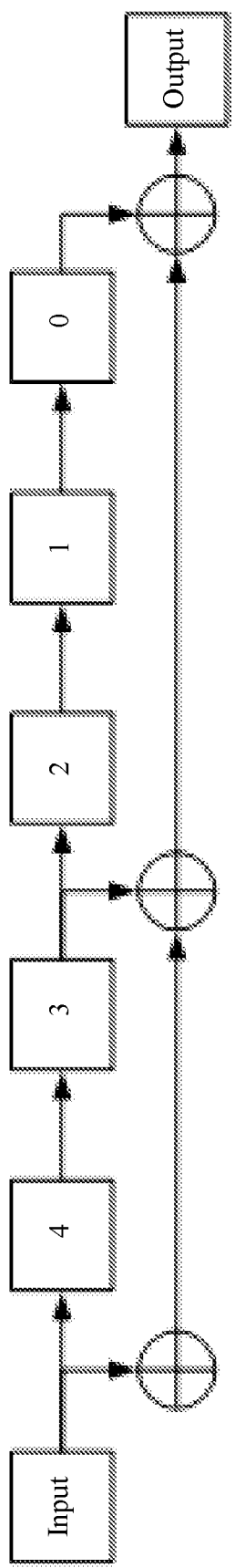
FIG. 4A is a schematic diagram of a shift register according to an embodiment of this application.

FIG. 4A is a schematic diagram of a shift register when outer-code encoding is performed by using the convolutional codes. In this case, in represents an input, and out represents an output. An input for an information bit location is an $i^{th}$ information bit ui, and an output is an exclusive OR bit value. An input for a frozen bit location is 0, and an output is an exclusive OR bit value.

2. Outer-Code Encoding Through Generalized CRC.

Figure 4B:
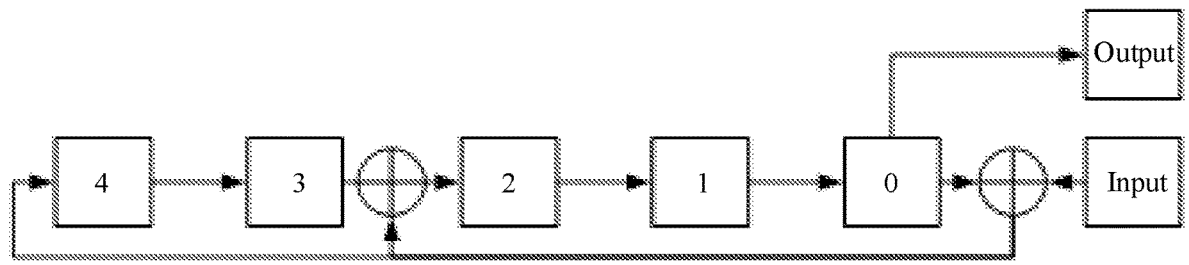
FIG. 4B is a schematic diagram of a shift register according to an embodiment of this application.

FIG. 4B is a schematic diagram of a shift register when outer-code encoding is performed by using the generalized CRC. In this case, in represents an input, and out represents an output. An input for an information bit location is an $i^{th}$ information bit ui, and an output is the $i^{th}$ information bit ui. An input for a frozen bit location is a value of a $0^{th}$ register (reg[0]), and an output is the value of the $0^{th}$ register.

It should be noted that, different from a common CRC, a location of the CRC bit herein may be selected from any frozen bit location, and does not need to be at the end.

3. Outer-Code Encoding Through Parity Check (PC).

FIG. 4B is a schematic diagram of a shift register when outer-code encoding is performed by using the parity check. In this case, in represents an input, and out represents an output. An input for an information bit location is an $i^{th}$ information bit ui, and an output is the $i^{th}$ information bit ui. An input for a frozen bit location is 0, and an output is a value of a $0^{th}$ register.

The outer-code encoding in this embodiment of this application is to perform outer-code encoding by connecting information bits of all code blocks together, so that an outer-code encoding result of a current code block is affected by a previous code block, and an outer-code encoding result of a next code block is also affected. To reduce decoding complexity, the outer-code encoding may skip all frozen bit locations before a first information bit location in each code block, and the shift register does not shift at these locations. That is, values of all frozen bit locations before the first information bit location in each code block are set to zero or any known constant.

In addition, the outer-code encoding may be performed independently by group. Before each group of encoding, the shift register is initialized according to the foregoing method. The groups may be overlapping or non-overlapping. If the groups are overlapping, an output of a previous group of registers is used as an input of a new group of registers.

The following describes different grouping manners by using FIG. 5A to FIG. 5E. It is assumed that the first to-be-encoded vector includes 8 bits: u1, u2, u3, u4, u5, u6, u7, and u8.

Figure 5A:
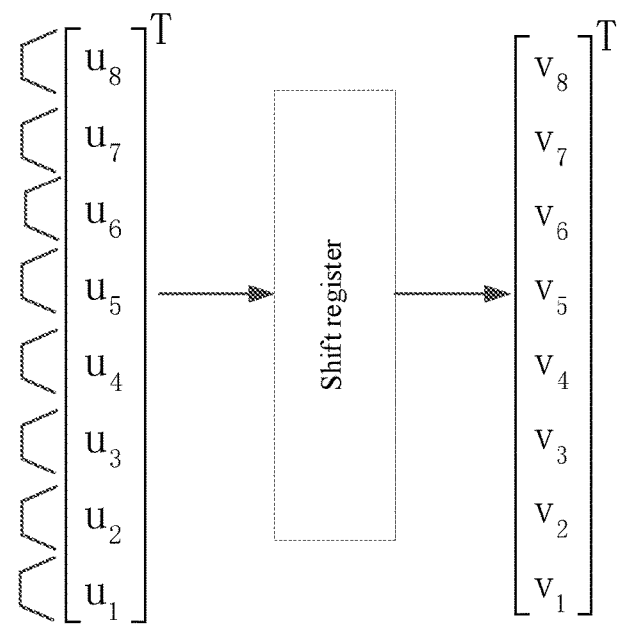
FIG. 5A is a schematic diagram of grouping first to-be-encoded vectors according to an embodiment of this application.

Refer to FIG. 5A, the sending device may use each bit in the first to-be-encoded vector as a group, and then perform outer-code encoding on each group. As shown in FIG. 5A, a quantity of bits in each group is 1, and the groups are non-overlapping. The sending device may perform outer-code encoding on 8 groups, to obtain a second to-be-encoded vector, including 8 bits: v1, v2, v3, v4, v5, v6, v7, and v8.

Figure 5B:
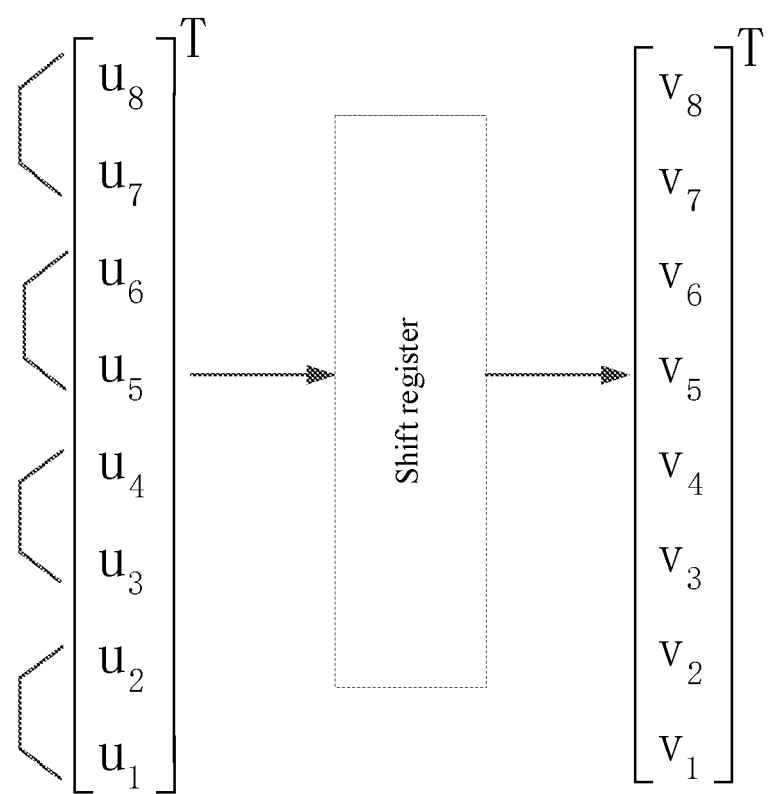
FIG. 5B is a schematic diagram of grouping first to-be-encoded vectors according to an embodiment of this application.

Refer to FIG. 5B, the sending device may use every two bits in the first to-be-encoded vector as a group, and then perform outer-code encoding on each group. As shown in FIG. 5B, a quantity of bits in each group is 2, and the groups are non-overlapping. The sending device may perform outer-code encoding on 4 groups, to obtain the second to-be-encoded vector, including 8 bits: v1, v2, v3, v4, v5, v6, v7, and v8.

Figure 5C:
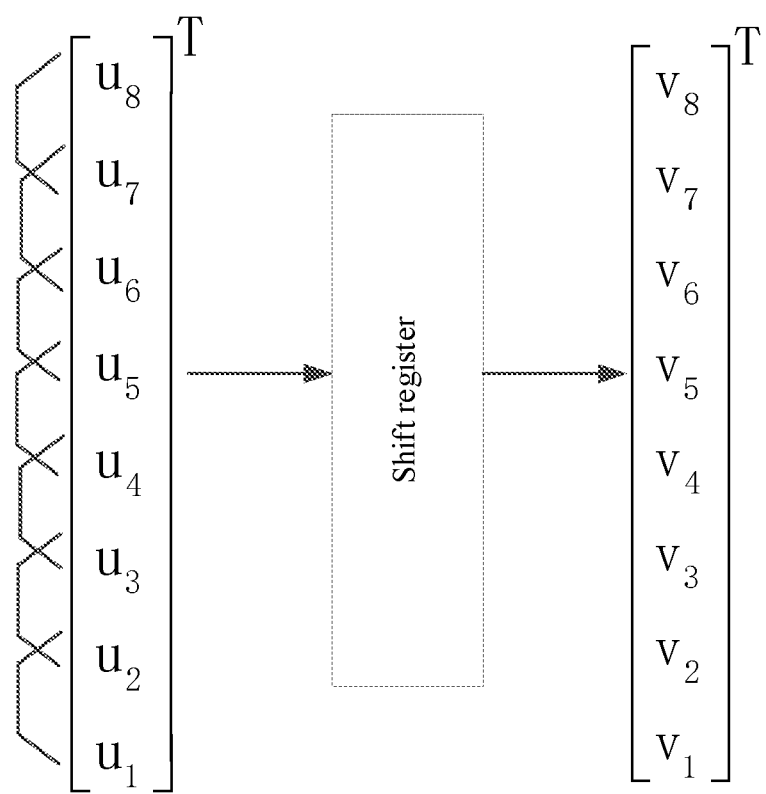
FIG. 5C is a schematic diagram of grouping first to-be-encoded vectors according to an embodiment of this application.

Refer to FIG. 5C, the sending device may use every two bits in the first to-be-encoded vector as a group, and then perform outer-code encoding on each group. As shown in FIG. 5C, a quantity of bits in each group is 2, and the groups are overlapping. The sending device may perform outer-code encoding on 7 groups, to obtain the second to-be-encoded vector, including 8 bits: v1, v2, v3, v4, v5, v6, v7, and v8.

Figure 5D:
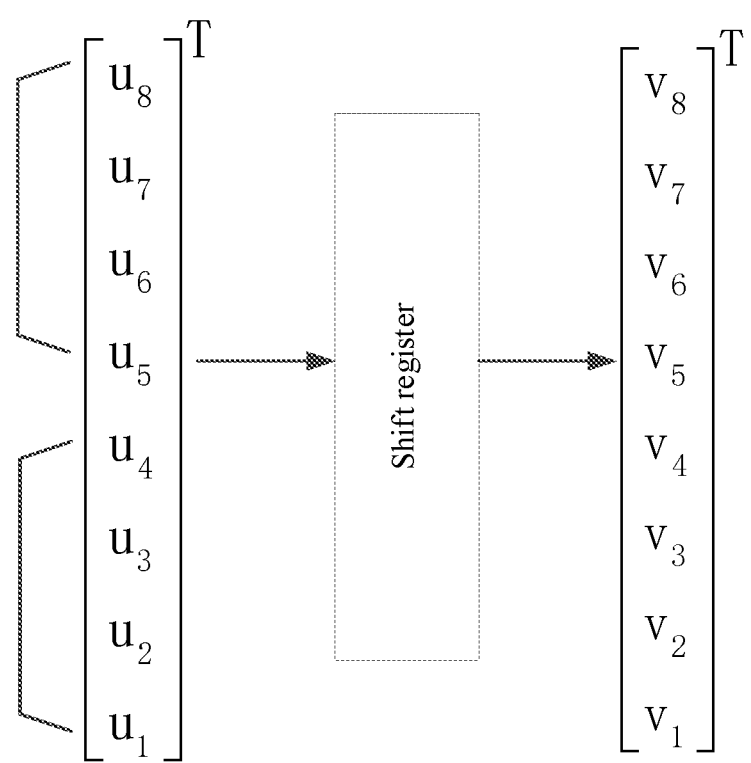
FIG. 5D is a schematic diagram of grouping first to-be-encoded vectors according to an embodiment of this application.

Refer to FIG. 5D, the sending device may use every four bits in the first to-be-encoded vector as a group, and then perform outer-code encoding on each group. As shown in FIG. 5D, a quantity of bits in each group is 4, and the groups are overlapping. The sending device may perform outer-code encoding on 2 groups, to obtain the second to-be-encoded vector, including 8 bits: v1, v2, v3, v4, v5, v6, v7, and v8.

Figure 5E:
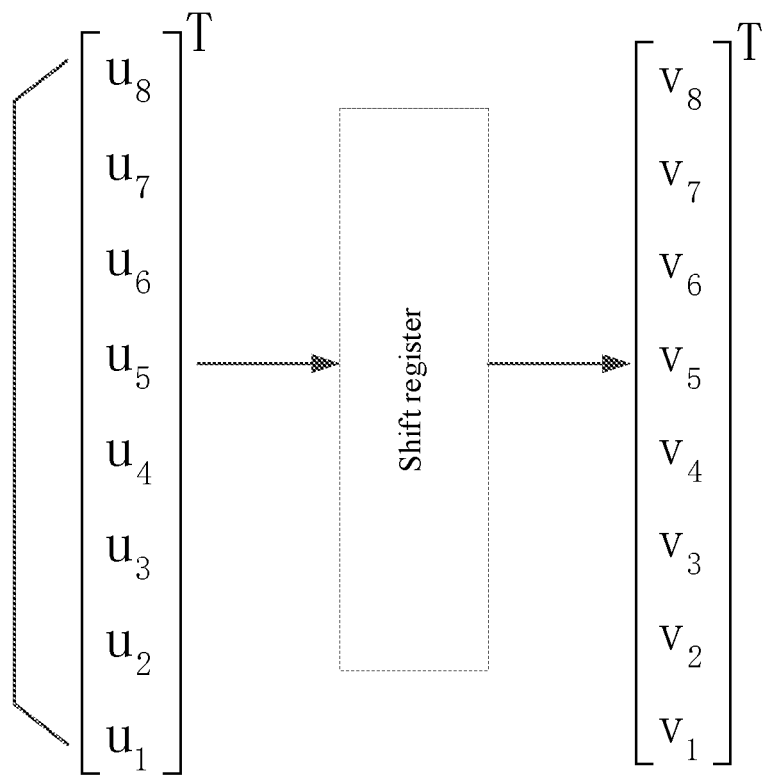
FIG. 5E is a schematic diagram of grouping first to-be-encoded vectors according to an embodiment of this application.

Refer to FIG. 5E, the sending device may use every 8 bits in the first to-be-encoded vector as a group, and then perform outer-code encoding on each group. As shown in FIG. 5E, a quantity of bits in each group is 8, and the groups are non-overlapping. The sending device may perform outer-code encoding on 1 group, to obtain the second to-be-encoded vector, including 8 bits: v1, v2, v3, v4, v5, v6, v7, and v8.

It should be noted that the first encoding may further include an interleaving operation. For example, the sending device may perform outer-code encoding on the first to-be-encoded vector after performing interleaving, or the sending device may perform interleaving on the first to-be-encoded vector after performing outer-code encoding.

Step 303: The sending device performs second encoding on the second to-be-encoded vector based on a first generator matrix, to obtain an encoded codeword.

The first generator matrix herein may include at least N+1 submatrices a. N of the submatrices a may be located on a main diagonal of the first generator matrix. The first generator matrix may be a block upper triangular matrix, or may be a block lower triangular matrix. a is a polar kernel matrix with a size of $2^m*2^m$, m is a natural number, and N is a natural number. The submatrix a is explained below.

The submatrix a may include a polar kernel $G_N$ and an element 0. The polar kernel $G_N$ may be distributed in a lower left corner of the submatrix a, and may be distributed in a triangle. The polar kernel $G_N$ may form an edge of the triangle. The following uses an example in which the submatrices a are respectively a polar kernel matrix with a size of 2*2 and a polar kernel matrix with a size of 4*4 for description. It should be noted that the submatrix a may alternatively be a polar kernel matrix with a size of 8*8, 16*16, or $2^m*2^m$. Optionally, the submatrix a may also be the polar kernel $G_N$.

Figure 6A:
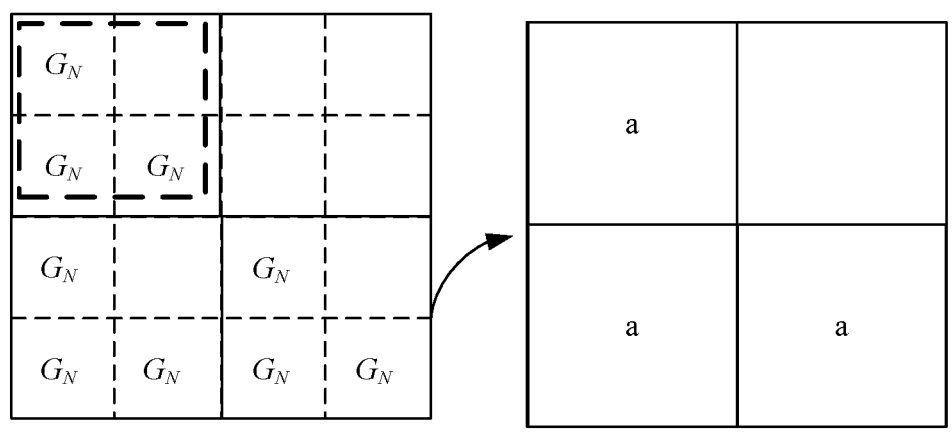
FIG. 6A is a schematic diagram of a submatrix a according to an embodiment of this application.

Refer to FIG. 6A, the submatrix a may be a 2*2 polar kernel matrix. The submatrix a may be $$\begin{bmatrix} G_N & 0 \\ G_N & G_N \end{bmatrix}.$$

Figure 6B:
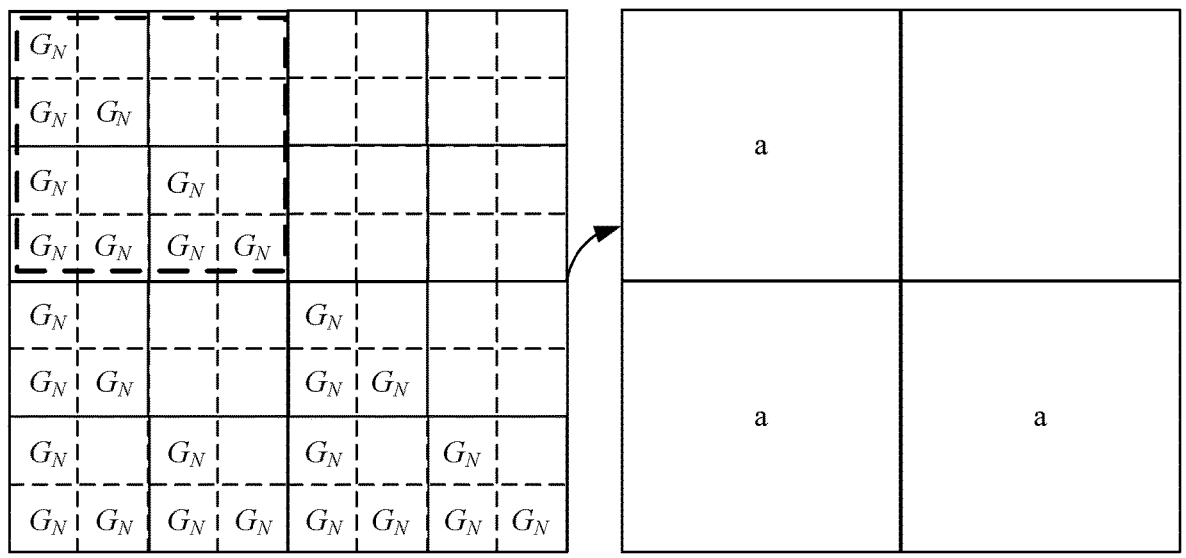
FIG. 6B is a schematic diagram of a submatrix a according to an embodiment of this application.

Refer to FIG. 6B, the submatrix a may be a 4*4 polar kernel matrix. The submatrix a may be $$\begin{bmatrix} G_N & 0 & 0 & 0 \\ G_N & G_N & 0 & 0 \\ G_N & 0 & G_N & 0 \\ G_N & G_N & G_N & G_N \end{bmatrix}.$$

The following describes the first generator matrix in this embodiment of this application. The first generator matrix may be classified into the following three types based on different coupling manners.

Type 1: Triangular Coupling.

The triangular coupling may be understood as that submatrices a in the first generator matrix is distributed in a triangle. It should be understood that the submatrices a may cover the triangle, or may form an edge of the triangle. In this embodiment of this application, an example in which the submatrices a cover the triangle is used for description.

Case 1: the First Generator Matrix is an Upper Triangular Matrix.

Figure 7A:
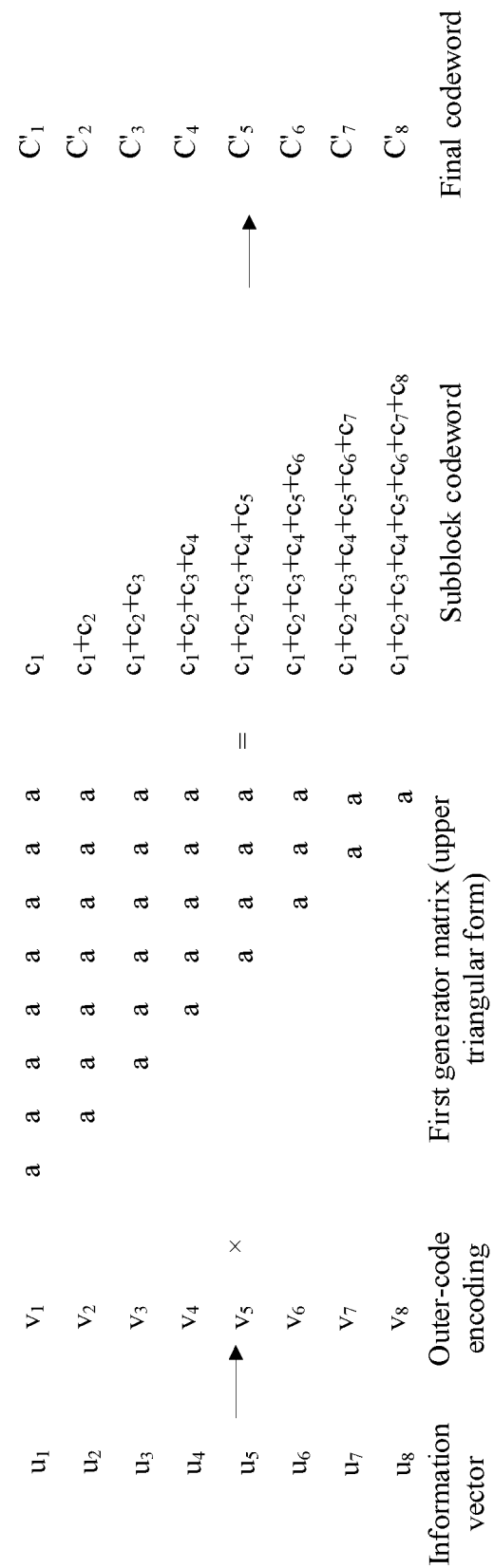
FIG. 7A is a schematic diagram of a first generator matrix according to an embodiment of this application.

To enable 1-pass decoding to start from a $1^{st}$ subblock, the $1^{st}$ subblock should be able to be decoded independently and cannot be superimposed with other subblock codewords. Therefore, a coupling polar matrix needs to be written in an upper triangular form, as shown in FIG. 7A. In FIG. 7A, that the first encoding vector includes 8 subblocks is used as an example. Each subblock may include a plurality of information bits and a plurality of frozen bits.

The sending device may sequentially fill the information bits and the frozen bits based on reliability of subchannels, to obtain a plurality of M-length information vectors ui. One M-length information vector ui may be considered as one second subblock. Then the sending device may perform outer-code encoding on the vector u with a total length of T*N, to obtain an outer-code codeword vector v with a same total length of T*N. And then, the vector v is multiplied by the coupling polar matrix in a binary field.

Optionally, the foregoing encoding process may also be decomposed into outer-code encoding, intra-subblock encoding, and inter-subblock coupling encoding. The sending device may perform outer-code encoding on the subblock ui, to obtain an outer-code sub-code block vi. Then, the sending device multiplies the outer-code sub-code block vi by the polar kernel $G_N$, to obtain a sub-codeword ci. The sending device may superimpose each sub-codeword ci in a coupling manner, to obtain a final codeword ci' of a coupling code. The coupling manner may be shown in FIG. 7A. Specifically, c1'=c1, c2'=c1+c2, c3'=c1+c2+c3, c4'=c1+c2+c3+c4, c5'=c1+c2+c3+c4+c5, c6'=c1+c2+c3+c4+c5+c6, c7'=c1+c2+c3+c4+c5+c6+c7, and c8'=c1+c2+c3+c4+c5+c6+c7+c8.

Case 2: the First Generator Matrix is a Lower Triangular Matrix.

Figure 7B:
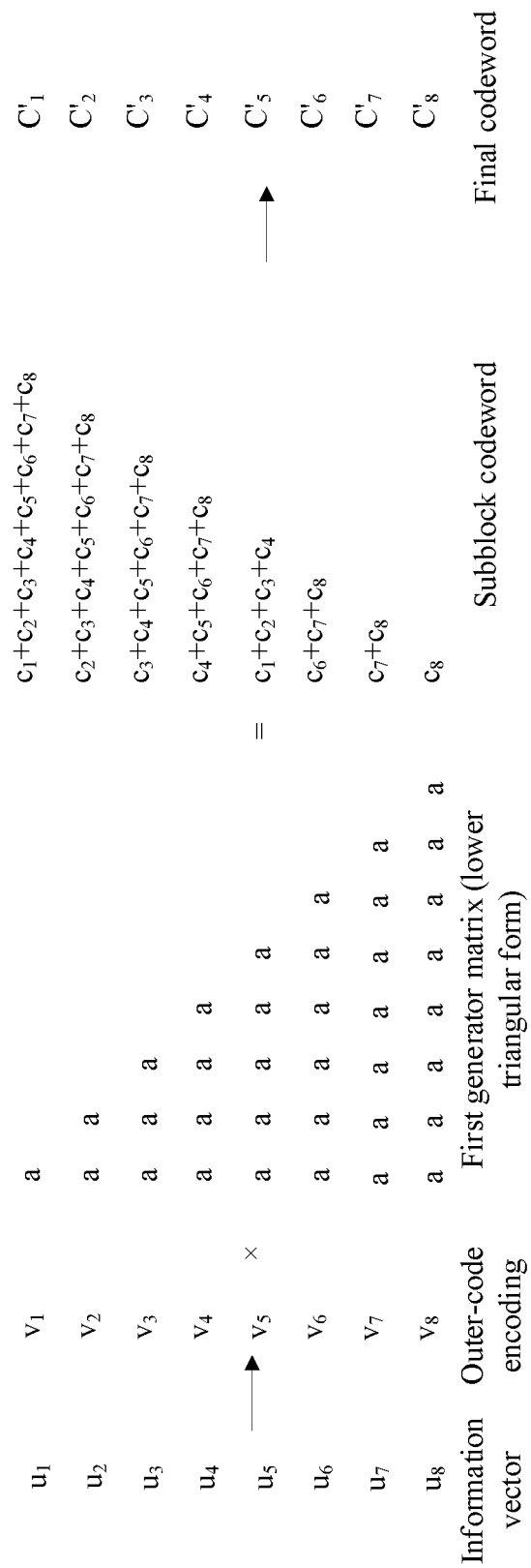
FIG. 7B is a schematic diagram of a first generator matrix according to an embodiment of this application.

Because log-likelihood ratio (LLR) soft decoupling needs to be performed, processing starts from a last sub-code block first, and the first generator matrix needs to be written in a lower triangular form, as shown in FIG. 7B. In FIG. 7B, an example in which the first encoding vector includes 8 subblocks is used for description. Each subblock may include a plurality of information bits and a plurality of frozen bits.

The sending device may sequentially fill the information bits and the frozen bits based on reliability of subchannels, to obtain M-length information vectors u. One M-length information vector ui may be considered as one second subblock. Then the sending device may perform outer-code encoding on the vector u with a total length of T*N, to obtain an outer-code codeword vector v with a same total length of T*N. And then, the vector v is multiplied by the coupling polar matrix in a binary field.

Optionally, the foregoing encoding process may also be decomposed into outer-code encoding, intra-subblock encoding, and inter-subblock coupling encoding. The sending device may perform outer-code encoding on the subblock ui, to obtain an outer-code sub-code block vi. Then, the sending device multiplies the outer-code sub-code block vi by the polar kernel $G_N$, to obtain a sub-codeword ci. The sending device may superimpose each sub-codeword ci in a coupling manner, to obtain a final codeword ci' of a coupling code. The coupling manner may be shown in FIG. 7B. Specifically, c1'=c1+c2+c3+c4+c5+c6+c7+c8, c2'=c2+c3+c4+c5+c6+c7+c8, c3'=c3+c4+c5+c6+c7+c8, c4'=c4+c5+c6+c7+c8, c5'=c5+c6+c7+c8, c6'=c6+c7+c8, c7'=c7+c8, and c8'=c8.

Based on the foregoing case 1 and case 2, the sending device may encode the to-be-encoded vector based on the first generator matrix, to obtain a codeword. In the codeword obtained by the sending device by encoding by using the first generator matrix, a plurality of subblocks are coupled, so that a high coupling code encoding gain can be obtained, and encoding performance can be improved.

In a possible implementation, when obtaining the first to-be-encoded vector, the sending device may first determine a quantity of second subblocks included in the first to-be-encoded vector. The sending device may determine a code rate of each second subblock based on an overall code rate of the codeword and the quantity of second subblocks. It should be understood that different second subblocks may have different code rates. The sending device may determine the first to-be-encoded vector based on the code rate of each second subblock and the quantity of second subblocks included in the first to-be-encoded vector.

In an example, the sending device may determine the code rate of each second subblock based on a pre-stored relationship among the overall code rate, the quantity of second subblocks included in the first to-be-encoded vector, and the code rate of each second subblock. For example, a code with an overall code length of N=1024 may be divided into 2 groups, and each group is divided into 4 second subblocks. In this case, a code length of each second subblock is 128, the second subblock is triangularly coupled only in a group, and there is no coupling relationship between second subblocks from different groups. If the overall code rate is ½, a total quantity of information bits is 512, and a quantity of information bits in each group is 512/2=256. Each group has 4 second subblocks, and polarization exists among the second subblocks. Therefore, a quantity of information bits of each second subblock is different from each other. Based on the pre-stored relationship among the overall code rate, the quantity of second subblocks included in the first to-be-encoded vector, and the code rate of each second subblock, it may be determined that quantities of information bits of a first, a second, a third, and a fourth second subblock are 33, 50, 54, and 119 respectively.

Optionally, code rates of two adjacent second subblocks in the first to-be-encoded vector may be consistent, and the first to-be-encoded vector includes at least two different code rates. The sending device may determine the code rate of each second subblock based on the quantity of second subblocks included in the first to-be-encoded vector and the overall code rate.

Based on the foregoing example, the relationship among the overall code rate, the quantity of second subblocks included in the first to-be-encoded vector, and the code rate of each second subblock may be determined by an overall code length, a total information length, an overall code rate, a quantity of second subblocks, a quantity of groups, a quantity of second subblocks in each group, and an information length of each second subblock. For details, see Table 1 to Table 9 below.

TABLE 1

| 4 subblocks in total are divided into 1 group with each group of 4 second subblocks | | | |
|---|---|---|---|
| Overall code length N | | 512 | |
| Total information length K | 256 | 128 | 64 |
| Overall code rate R | 1/2 | 1/4 | 1/8 |
| Information length of a second subblock 1 | 33 | 6 | 1 |

TABLE 1-continued

| 4 subblocks in total are divided into 1 group with each group of 4 second subblocks | | | |
|---|---|---|---|
| Information length of a second subblock 2 | 50 | 15 | 4 |
| Information length of a second subblock 3 | 54 | 18 | 5 |
| Information length of a second subblock 4 | 119 | 89 | 54 |

TABLE 2

| 4 subblocks in total are divided into 1 group with each group of 4 second subblocks | | | |
|---|---|---|---|
| Overall code length N | | 4096 | |
| Total information length K | 2048 | 1024 | 512 |
| Overall code rate R | 1/2 | 1/4 | 1/8 |
| Information length of a second subblock 1 | 15 | 62 | 15 |
| Information length of a second subblock 2 | 29 | 115 | 29 |
| Information length of a second subblock 3 | 45 | 154 | 45 |
| Information length of a second subblock 4 | 423 | 693 | 423 |

TABLE 3

| 4 subblocks in total are divided into 1 group with each group of 4 second subblocks | | | |
|---|---|---|---|
| Overall code length N | | 16384 | |
| Total information length K | 8192 | 4096 | 2048 |
| Overall code rate R | 1/2 | 1/4 | 1/8 |
| Information length of a second subblock 1 | 1075 | 261 | 63 |
| Information length of a second subblock 2 | 1569 | 471 | 126 |
| Information length of a second subblock 3 | 1776 | 611 | 179 |
| Information length of a second subblock 4 | 3772 | 2753 | 1680 |

TABLE 4

| 8 subblocks in total are divided into 2 group with each group of 4 second subblocks | | | |
|---|---|---|---|
| Overall code length N | | 1024 | |
| Total information length K | 512 | 256 | 128 |
| Overall code rate R | 1/2 | 1/4 | 1/8 |
| Information length of a second subblock 1 | 33 | 6 | 1 |
| Information length of a second subblock 2 | 50 | 15 | 4 |
| Information length of a second subblock 3 | 54 | 18 | 5 |
| Information length of a second subblock 4 | 119 | 89 | 54 |

TABLE 5

8 subblocks in total are divided into 2 group with
each group of 4 second subblocks

| | | | |
|---|---|---|---|
| Overall code length N | | 8192 | |
| Total information length K | 4096 | 2048 | 1024 |
| Overall code rate R | ½ | ¼ | ⅛ |
| Information length of a second subblock 1 | 269 | 62 | 15 |
| Information length of a second subblock 2 | 393 | 115 | 29 |
| Information length of a second subblock 3 | 442 | 154 | 45 |
| Information length of a second subblock 4 | 944 | 693 | 423 |

TABLE 6

8 subblocks in total are divided into 2 group with
each group of 4 second subblocks

| | | | |
|---|---|---|---|
| Overall code length N | | 32768 | |
| Total information length K | 16384 | 8192 | 4096 |
| Overall code rate R | ½ | ¼ | ⅛ |
| Information length of a second subblock 1 | 1075 | 261 | 63 |
| Information length of a second subblock 2 | 1569 | 471 | 126 |
| Information length of a second subblock 3 | 1776 | 611 | 179 |
| Information length of a second subblock 4 | 3772 | 2753 | 1680 |

TABLE 7

8 subblocks in total are divided into 1 group with
each group of 8 second subblocks

| | | | |
|---|---|---|---|
| Overall code length N | | 1024 | |
| Total information length K | 512 | 256 | 128 |
| Overall code rate R | ½ | ¼ | ⅛ |
| Information length of a second subblock 1 | 37 | 7 | 1 |
| Information length of a second subblock 2 | 53 | 16 | 4 |
| Information length of a second subblock 3 | 59 | 20 | 5 |
| Information length of a second subblock 4 | 59 | 21 | 6 |
| Information length of a second subblock 5 | 59 | 23 | 6 |
| Information length of a second subblock 6 | 59 | 24 | 7 |
| Information length of a second subblock 7 | 59 | 26 | 9 |
| Information length of a second subblock 8 | 127 | 119 | 90 |

TABLE 8

8 subblocks in total are divided into 1 group with
each group of 8 second subblocks

| | | | |
|---|---|---|---|
| Overall code length N | | 8192 | |
| Total information length K | 4096 | 2048 | 1024 |
| Overall code rate R | ½ | ¼ | ⅛ |
| Information length of a second subblock 1 | 285 | 65 | 13 |
| Information length of a second subblock 2 | 415 | 121 | 28 |

TABLE 8-continued 8 subblocks in total are divided into 1 group with
each group of 8 second subblocks

| | | | |
|---|---|---|---|
| Information length of a second subblock 3 | 461 | 158 | 43 |
| Information length of a second subblock 4 | 475 | 180 | 54 |
| Information length of a second subblock 5 | 480 | 194 | 62 |
| Information length of a second subblock 6 | 482 | 202 | 65 |
| Information length of a second subblock 7 | 483 | 206 | 72 |
| Information length of a second subblock 8 | 1015 | 922 | 687 |

TABLE 9

8 subblocks in total are divided into 1 group with
each group of 8 second subblocks

| | | | |
|---|---|---|---|
| Overall code length N | | 32768 | |
| Total information length K | 16384 | 8192 | 4096 |
| Overall code rate R | ½ | ¼ | ⅛ |
| Information length of a second subblock 1 | 1123 | 268 | 61 |
| Information length of a second subblock 2 | 1637 | 478 | 121 |
| Information length of a second subblock 3 | 1829 | 626 | 173 |
| Information length of a second subblock 4 | 1905 | 716 | 216 |
| Information length of a second subblock 5 | 1937 | 776 | 248 |
| Information length of a second subblock 6 | 1942 | 823 | 277 |
| Information length of a second subblock 7 | 1952 | 849 | 299 |
| Information length of a second subblock 8 | 4059 | 3656 | 2701 |

Based on the foregoing grouping and code rate matching of the to-be-encoded information bits and the constructed first generator matrix, an encoding manner in this embodiment of this application has a gain of 0.3 dB to 1 dB compared with that of an uncoupling code.

Figure 8A:
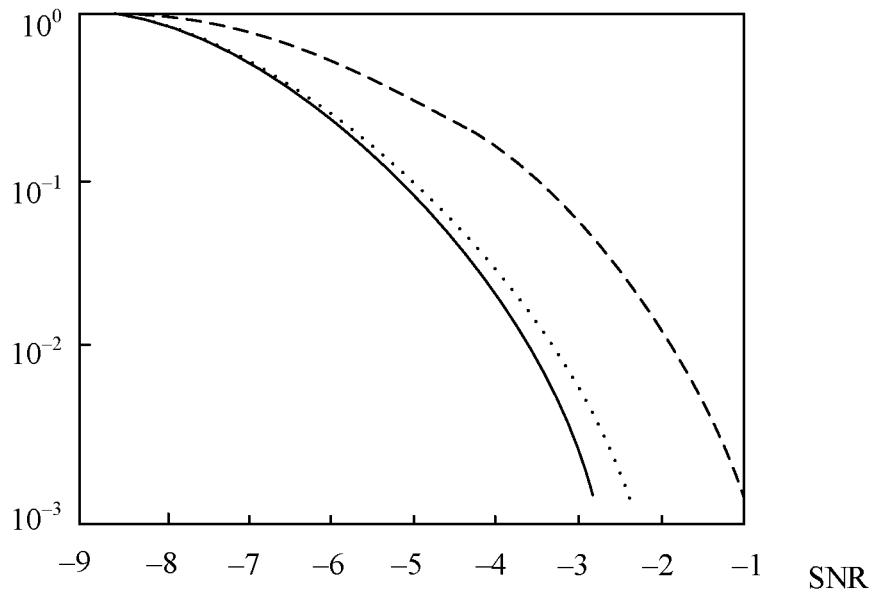
FIG. 8A is a schematic diagram of decoding performance according to an embodiment of this application.
Figure 8A:
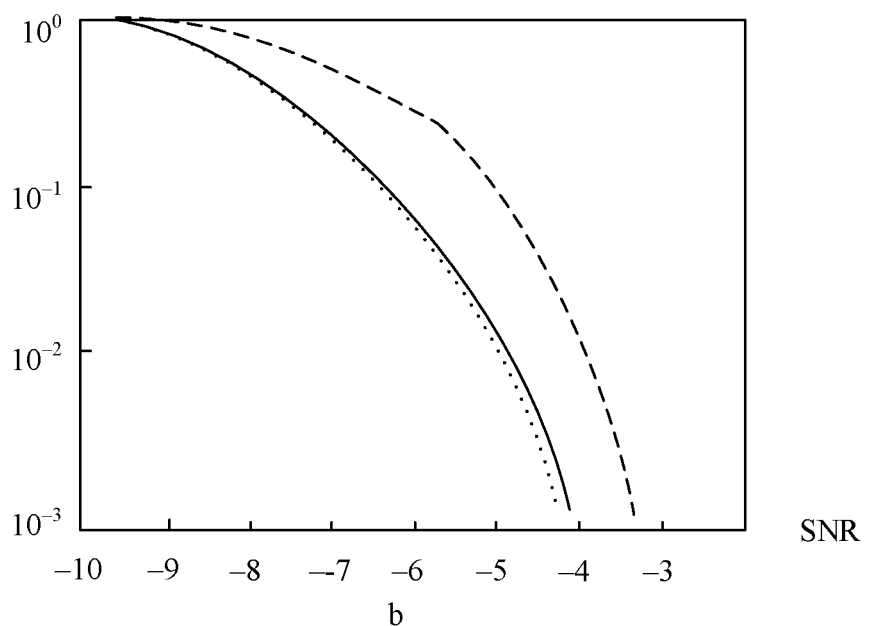

FIG. 8A is a simulation effect diagram of different encoding manners. In FIG. 8A, an SC decoding method is used in figure a, and an SCL decoding manner is used in figure b. Figure a is used as an example, where a horizontal axis indicates a signal to noise ratio (SNR), and a vertical axis indicates a block error rate (BLER). The figure is expressed in EsNo, namely, a logarithmic form of a power ratio of a transmitted symbol to noise, which is in a unit of dB. It can be learned that, in a case of a same signal to noise ratio, a bit error rate of a long code is the lowest, a bit error rate of the encoding manner in this embodiment of this application is slightly higher than a bit error rate of a long code, and a bit error rate of a short code is the highest. However, because complexity of the long code is high, the encoding manner provided in this embodiment of this application can reduce the complexity, and can also increase the encoding gain. In FIG. 8A, the overall code length N=512, and the total information length K=64. Compared with the SC decoding, the SCL decoding can further reduce the bit error rate. According to the encoding manner provided in this embodiment of this application, when decoding is performed by using the SCL, the bit error rate is lower than that of the long code and the short code.

Figure 8B:
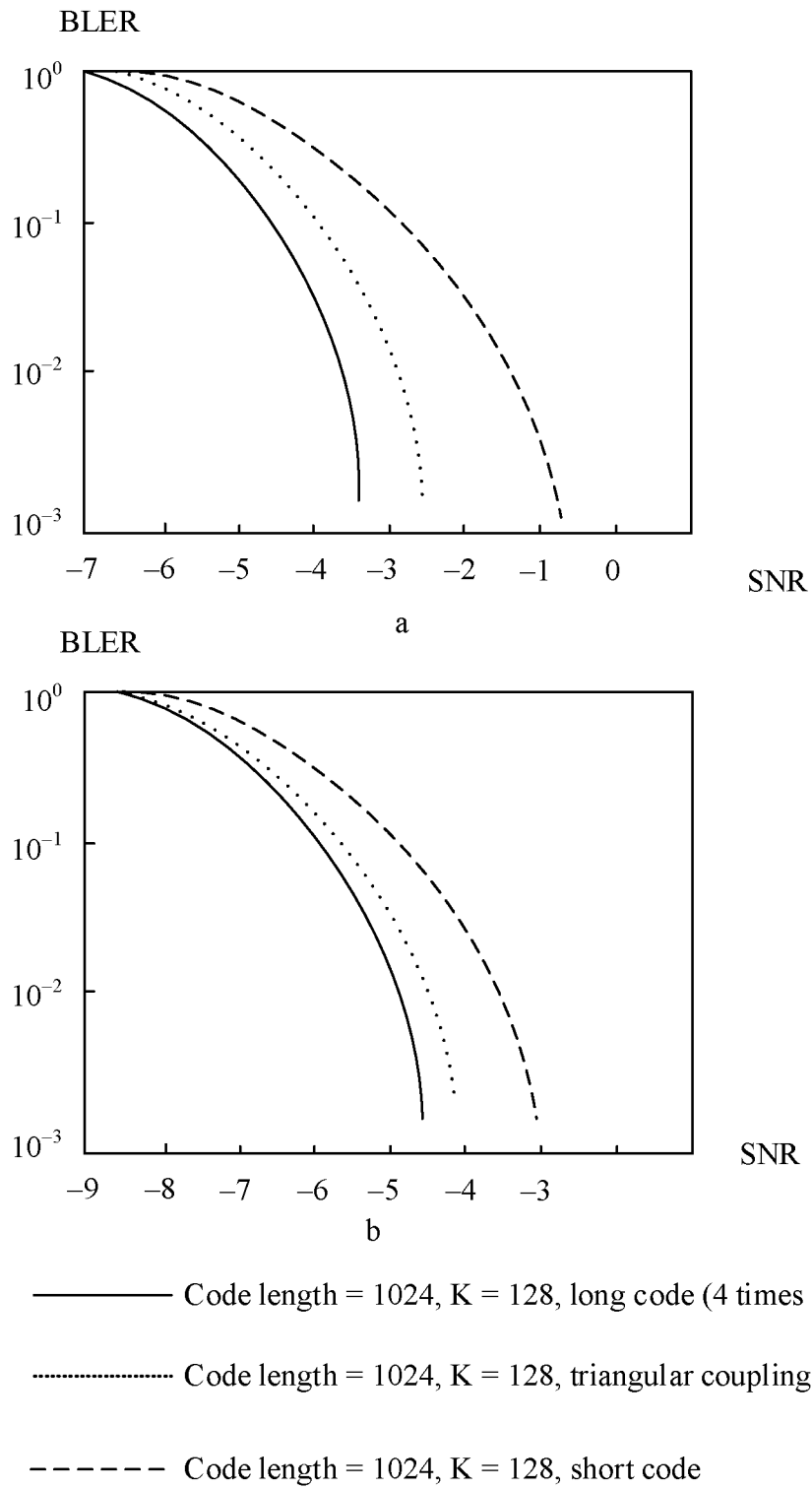
FIG. 8B is a schematic diagram of decoding performance according to an embodiment of this application.

FIG. 8B is a simulation effect diagram of different encoding manners. In FIG. 8B, an SC decoding method is used in figure a, and an SCL decoding manner is used in figure b. Figure a is used as an example, where a horizontal axis indicates a signal to noise ratio (SNR), and a vertical axis indicates a block error rate (BLER). The figure is expressed in EsNo, namely, a logarithmic form of a power ratio of a transmitted symbol to noise, which is in a unit of dB. It can be learned that, in a case of a same signal to noise ratio, a bit error rate of a long code is the lowest, a bit error rate of the encoding manner in this embodiment of this application is slightly higher than a bit error rate of a long code, and a bit error rate of a short code is the highest. However, because complexity of the long code is high, the encoding manner provided in this embodiment of this application can reduce the complexity, and can also increase the encoding gain. In FIG. 8B, the overall code length N=1024, and the total information length K=128. Compared with the SC decoding, the SCL decoding has a higher bit error rate.

It can be learned from FIG. 8A and FIG. 8B that, in a case of a same code rate, a bit error rate of a triangular coupling matrix encoding manner provided in this embodiment of this application is obviously lower than that of the short code, and is slightly different from a bit error rate of the long code, but complexity of the triangular coupling matrix encoding manner is lower than that of the long code.

In a triangularly coupled 1-pass matrix, because only hard bits are used for decoupling instead of LLR decoupling, each subblock has same input LLR reliability, and a polar code construction of a subblock is the same as that of a common polar code.

In a triangularly coupled 2-pass matrix, reliability of each subcode block is different. Therefore, a construction method is different from that in the 1-pass matrix. First, overall input reliability of the subblock is calculated to obtain a code rate of each subblock. Equivalently, a quantity of information bits of each subblock may be obtained. Then, reliability of each subchannel in the subblock is calculated. This part is the same as a construction method of an original polar code.
Type 2: Adjacent Coupling.

An adjacently coupled generator matrix may include K first subblocks. The K first subblocks are located on the main diagonal of the first generator matrix, and adjacent first subblocks partially overlap. K herein is greater than or equal to 2. The first subblock may be $$\begin{bmatrix} a & 0 \\ a & a \end{bmatrix} \text{ or } \begin{bmatrix} a & a \\ 0 & a \end{bmatrix}.$$

The following separately describes different adjacently coupled generator matrixes based on different cases of the first subblock.
Case 1: the First Subblock is $$\begin{bmatrix} a & 0 \\ a & a \end{bmatrix}.$$

Figure 9A:
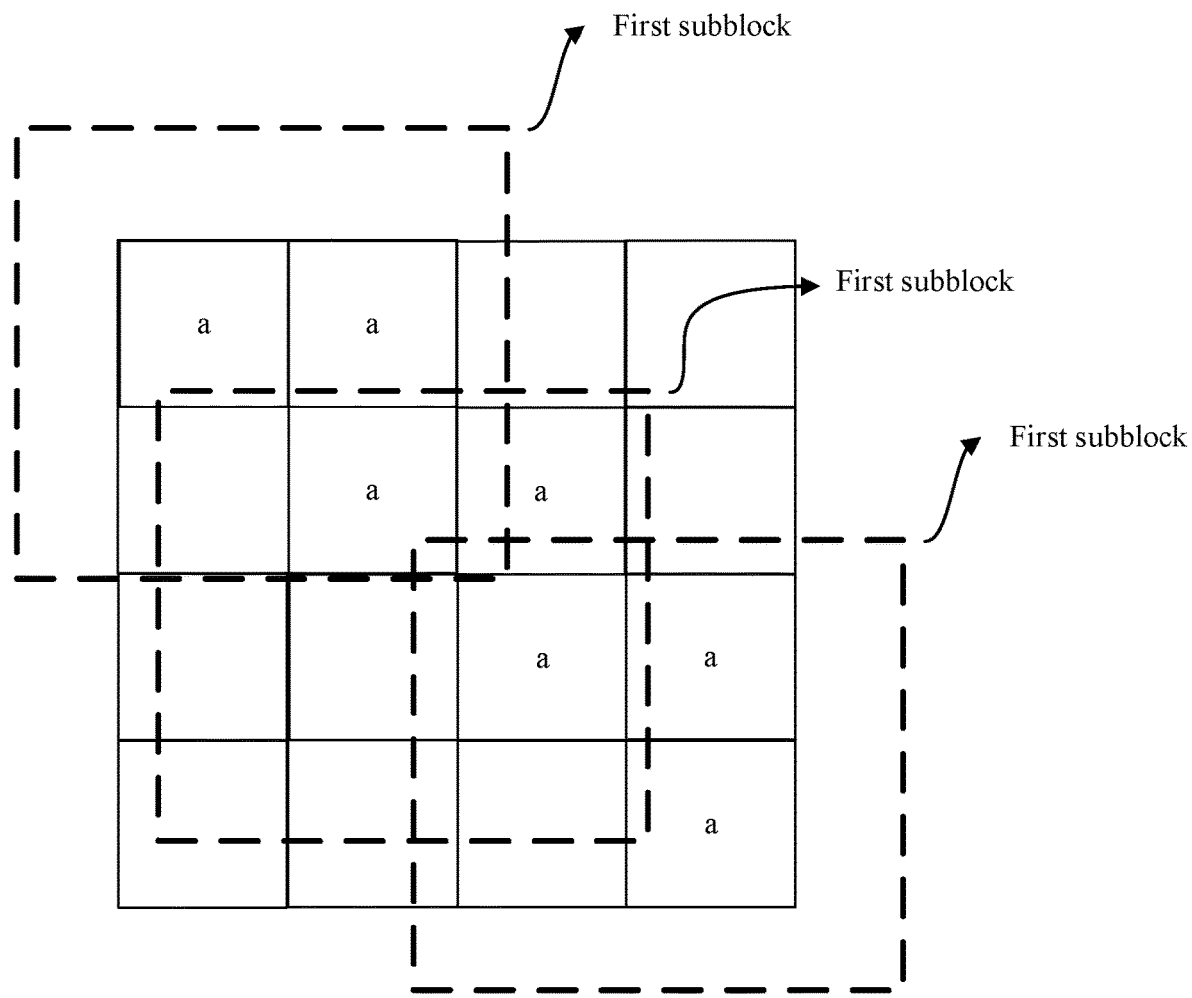
FIG. 9A is a schematic diagram of a first subblock according to an embodiment of this application.

Refer to FIG. 9A, the first subblock in this embodiment of this application is described. FIG. 9A shows a generator matrix with a size of 4*4, and the generator matrix includes submatrices a and an element 0. As shown in FIG. 9A, the generator matrix includes 3 first subblocks. The 3 first subblocks are located on the main diagonal of the first generator matrix.

Figure 9B:
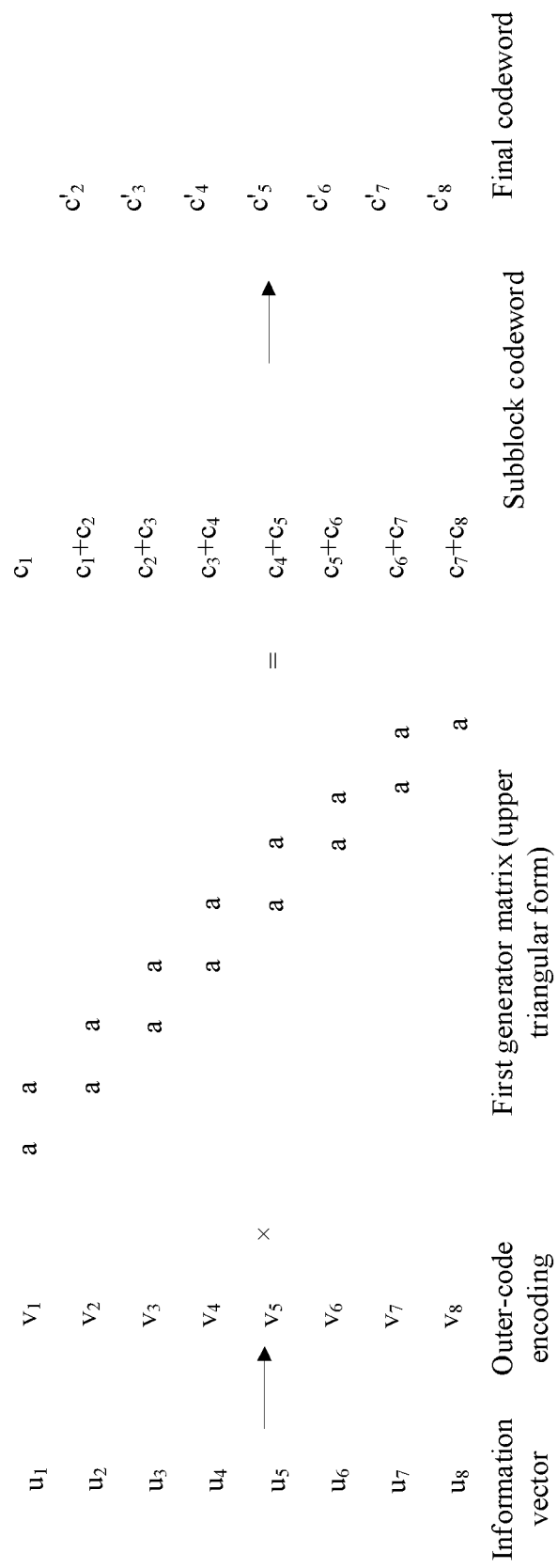
FIG. 9B is a schematic diagram of a first generator matrix according to an embodiment of this application.

To enable 1-pass decoding to start from a $1^{st}$ subblock, the $1^{st}$ subblock should be able to be decoded independently and cannot be superimposed with other subblock codewords. Therefore, the coupling polar matrix needs to be written in an upper triangular form, as shown in FIG. 9B. In FIG. 9B, that the first generator matrix includes 7 first subblocks is used as an example. The first to-be-encoded vector includes 8 small blocks and 7 second subblocks.

The sending device may sequentially fill the information bits and the frozen bits based on reliability of subchannels, to obtain a plurality of M-length information vectors ui. Then the sending device may perform outer-code encoding on the vector u with a total length of T*N, to obtain an outer-code codeword vector v with a same total length of T*N. And then, the vector v is multiplied by the coupling polar matrix in a binary field. In FIG. 9B, the second subblock 1 may be u1+u2, the second subblock 2 may be u2+u3, the second subblock 3 may be u3+u4, the second subblock 4 may be u4+u5, the second subblock 5 may be u5+u6, the second subblock 6 may be u6+u7, and the second subblock 7 may be u7+u8.

Optionally, the foregoing encoding process may also be decomposed into outer-code encoding, intra-subblock encoding, and inter-subblock coupling encoding. The sending device may perform outer-code encoding on the subblock ui, to obtain an outer-code sub-code block vi. Then, the sending device multiplies the outer-code sub-code block vi by the polar kernel $G_N$, to obtain a sub-codeword ci. The sending device may superimpose each sub-codeword ci in a coupling manner, to obtain a final codeword ci' of a coupling code. The coupling manner may be shown in FIG. 9B. Specifically, c1'=c1, c2'=c1+c2, c3'=c2+c3, c4'=c3+c4, c5'=c4+c5, c6'=c5+c6, c7'=c6+c7, and c8'=c7+c8.
Case 2: the First Subblock is $$\begin{bmatrix} a & a \\ 0 & a \end{bmatrix}.$$

Figure 10A:
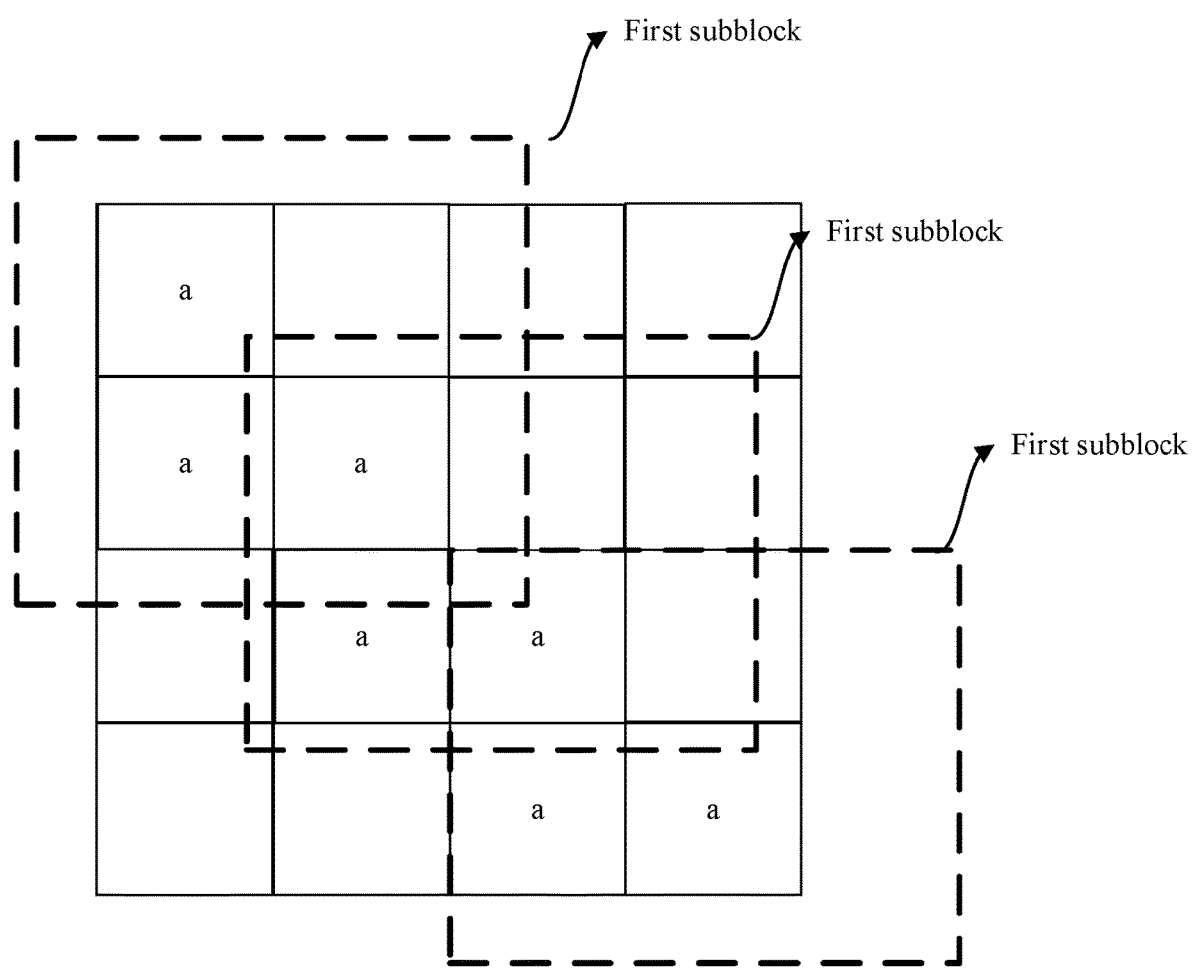
FIG. 10A is a schematic diagram of a first subblock according to an embodiment of this application.

Refer to FIG. 10A, the first subblock in this embodiment of this application is described. FIG. 10A shows a generator matrix with a size of 4*4, and the generator matrix includes submatrices a and an element 0. As shown in FIG. 10A, the generator matrix includes 3 first subblocks. The 3 first subblocks are located on the main diagonal of the first generator matrix.

Figure 10B:
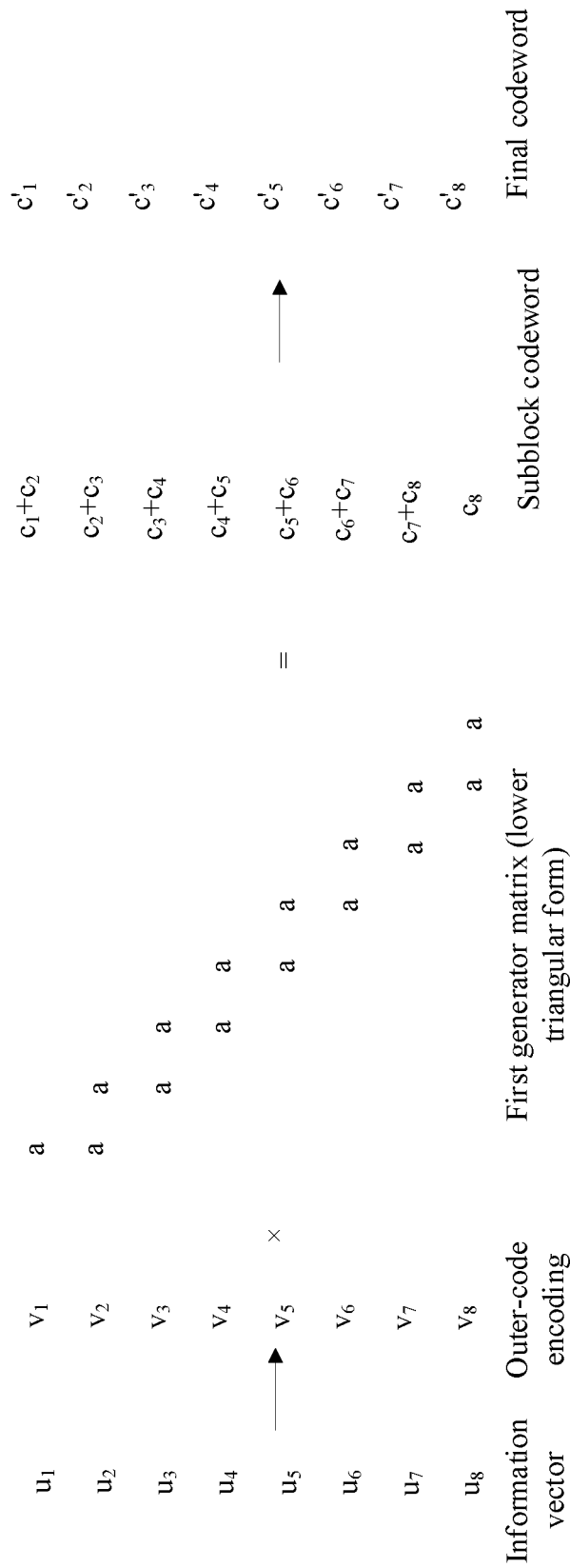
FIG. 10B is a schematic diagram of a first generator matrix according to an embodiment of this application.

Because LLR soft decoupling needs to be performed, processing starts from a last sub-code block first, and the first generator matrix needs to be written in a lower triangular form, as shown in FIG. 10B. In FIG. 10B, that the first generator matrix includes 7 first subblocks is used as an example. The first to-be-encoded vector includes 8 small blocks and 7 second subblocks.

The sending device may sequentially fill the information bits and the frozen bits based on reliability of subchannels, to obtain a plurality of M-length information vectors ui. Then the sending device may perform outer-code encoding on the vector ui with a total length of T*N, to obtain an outer-code codeword vector v with a same total length of T*N. And then, the vector v is multiplied by the coupling polar matrix in a binary field. In FIG. 10B, the second subblock 1 may be u1+u2, the second subblock 2 may be u2+u3, the second subblock 3 may be u3+u4, the second subblock 4 may be u4+u5, the second subblock 5 may be u5+u6, the second subblock 6 may be u6+u7, and the second subblock 7 may be u7+u8.

Optionally, the foregoing encoding process may also be decomposed into outer-code encoding, intra-subblock encoding, and inter-subblock coupling encoding. The sending device may perform outer-code encoding on the subblock ui, to obtain an outer-code sub-code block vi. Then, the sending device multiplies the outer-code sub-code block vi by the polar kernel $G_N$, to obtain a sub-codeword ci. The sending device may superimpose each sub-codeword ci in a coupling manner, to obtain a final codeword ci' of a coupling code. The coupling manner may be shown in FIG. 10B. Specifically, c1'=c1+c2, c2'=c2+c3, c3'=c3+c4, c4'=c4+c5, c5'=c5+c6, c6'=c6+c7, c7'=c7+c8, and c8'=c8.

Based on the foregoing case 1 and case 2, in the codeword obtained by the sending device by encoding by using the first generator matrix, two adjacent subblocks are coupled, so that a coupling code encoding gain can be obtained, and encoding performance can be improved.

Type 3: Tail Biting Coupling.

The tail biting coupling herein is determined based on an adjacently coupled generator matrix, and may be classified into the following two cases.

Case 1: the First Generator Matrix is in an Upper Triangular Form.

Figure 11A:
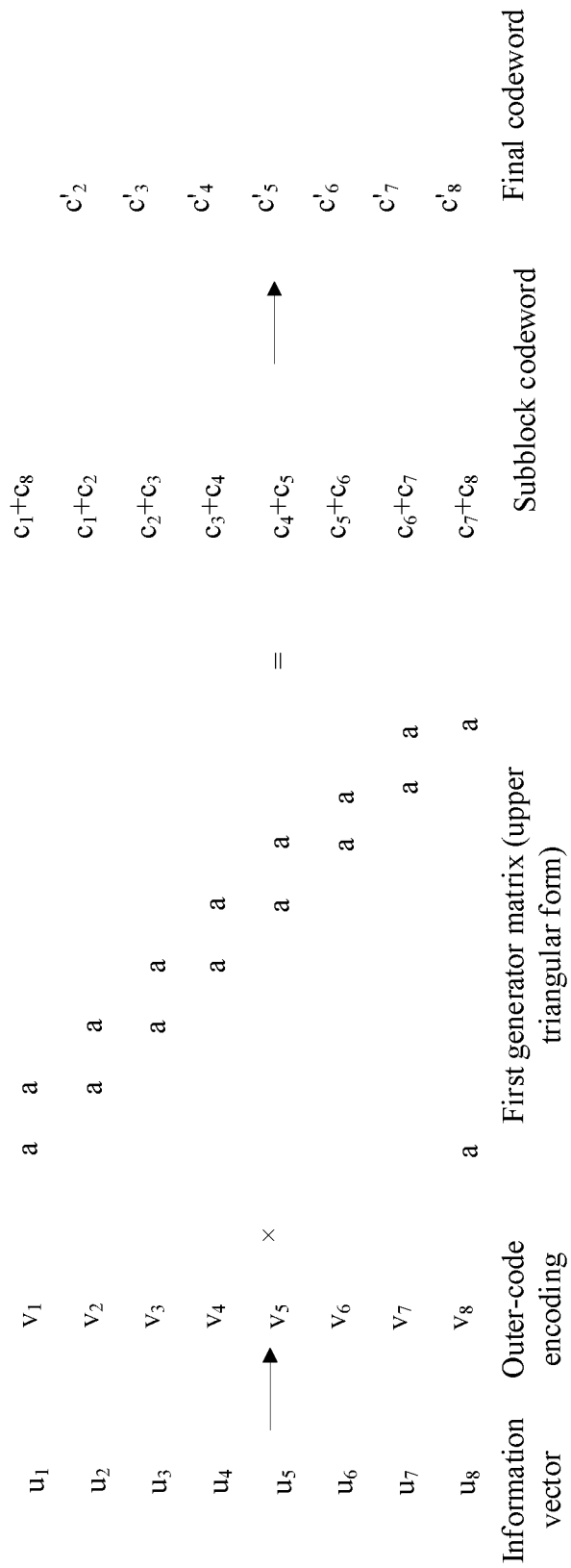
FIG. 11A is a schematic diagram of a first generator matrix according to an embodiment of this application.

If the first generator matrix is written in the upper triangular form, one submatrix a is located in a lower left corner of the first generator matrix, as shown in FIG. 11A. In FIG. 11A, the first generator matrix may include 7 first subblocks, each of the first subblocks includes 16 submatrices a, and the first generator matrix further includes 1 submatrix a located in the lower left corner of the first generator matrix.

The sending device may perform outer-code encoding on the plurality of M-length information vectors ui each with a total length of T*N, to obtain an outer-code codeword vector v with a same total length of T*N. And then, the vector v is multiplied by the coupling polar matrix in a binary field. In FIG. 11A, the second subblock 1 may be u1+u2, the second subblock 2 may be u2+u3, the second subblock 3 may be u3+u4, the second subblock 4 may be u4+u5, the second subblock 5 may be u5+u6, the second subblock 6 may be u6+u7, and the second subblock 7 may be u7+u8.

Optionally, the foregoing encoding process may also be decomposed into outer-code encoding, intra-subblock encoding, and inter-subblock coupling encoding. The sending device may perform outer-code encoding on the subblock ui, to obtain an outer-code sub-code block vi. Then, the sending device multiplies the outer-code sub-code block vi by the polar kernel $G_N$, to obtain a sub-codeword ci. The sending device may superimpose each sub-codeword ci in a coupling manner, to obtain a final codeword ci' of a coupling code. The coupling manner may be shown in FIG. 11A. Specifically, c1'=c1+c2, c2'=c2+c3, c3'=c3+c4, c4'=c4+c5, c5'=c530 c6, c6'=c6+c7, c'=c7+c8, and c8'=c8+c1.

Case 2: the First Generator Matrix is in a Lower Triangular Form.

Figure 11B:
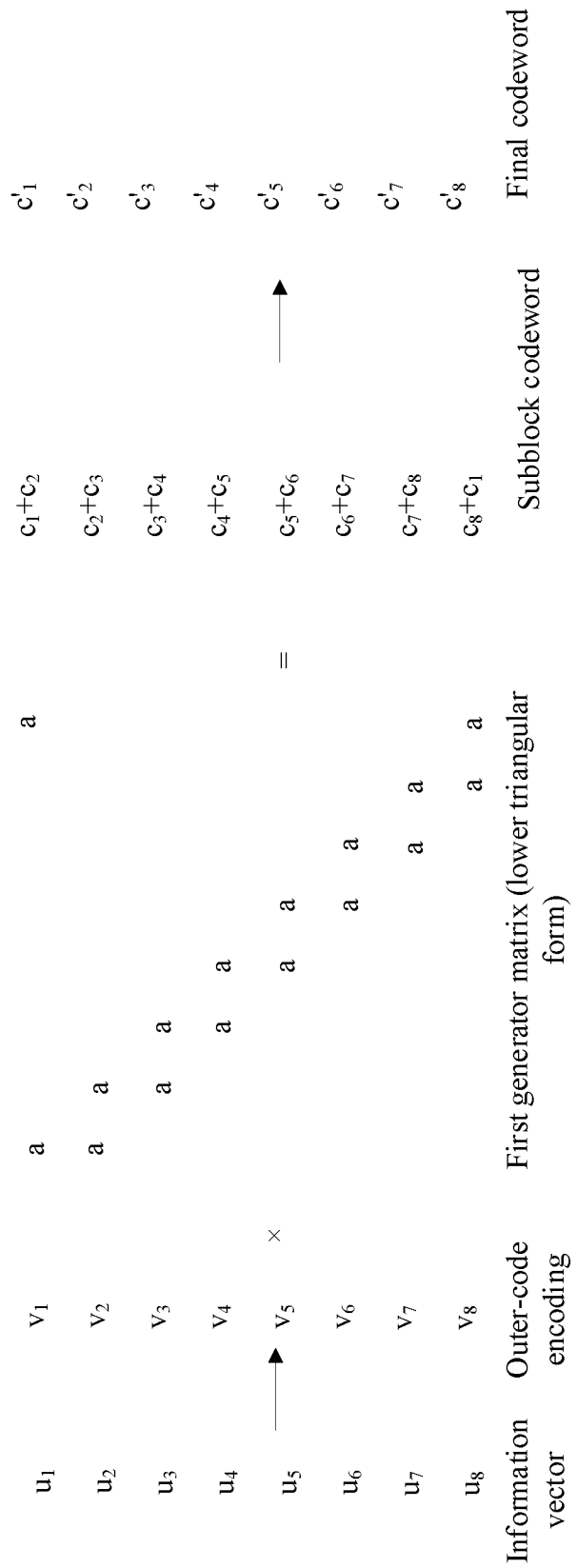
FIG. 11B is a schematic diagram of a first generator matrix according to an embodiment of this application.

If the first generator matrix is written in the lower triangular form, one submatrix a is located in an upper right corner of the first generator matrix, as shown in FIG. 11B. In FIG. 11B, the first generator matrix may include 7 first subblocks, each of the first subblocks includes 16 submatrices a, and the first generator matrix further includes 1 submatrix a located in the upper right corner of the first generator matrix.

The sending device may perform outer-code encoding on the plurality of M-length information vectors ui each with a total length of T*N, to obtain an outer-code codeword vector v with a same total length of T*N. And then, the vector v is multiplied by the coupling polar matrix in a binary field. In FIG. 11B, the second subblock 1 may be u1+u2, the second subblock 2 may be u2+u3, the second subblock 3 may be u3+u4, the second subblock 4 may be u4+u5, the second subblock 5 may be u5+u6, the second subblock 6 may be u6+u7, and the second subblock 7 may be u7+u8.

Optionally, the foregoing encoding process may also be decomposed into outer-code encoding, intra-subblock encoding, and inter-subblock coupling encoding. The sending device may perform outer-code encoding on the subblock ui, to obtain an outer-code sub-code block vi. Then, the sending device multiplies the outer-code sub-code block vi by the polar kernel $G_N$, to obtain a sub-codeword ci. The sending device may superimpose each sub-codeword ci in a coupling manner, to obtain a final codeword ci' of a coupling code. The coupling manner may be shown in FIG. 11A. Specifically, ci'=c1+c8, c2'=c1+c2, c3'=c2+c3, c4'=c3+c4, c5'=c4+c5, c6'=c5+c6, c7'=c6+c7, and c8'=c7+c8.

In a possible implementation, in a case that encoding is performed based on the adjacently coupled generator matrix and a tail biting coupled generator matrix, when obtaining the first to-be-encoded vector, the sending device may determine a quantity of second subblocks included in the first to-be-encoded vector. The sending device may determine a code rate of each second subblock based on an overall code rate of the codeword and the quantity of second subblocks. The second subblocks may have different code rates. The sending device may determine the first to-be-encoded vector based on the code rate of each second subblock.

In an example, the sending device may determine the code rate of the second subblock based on a pre-stored relationship among the overall code rate, the quantity of second subblocks, and the code rate of each second subblock. For example, a code with an overall code length of N=1024 may be divided into 2 groups, and each group is divided into 4 small blocks. In this case, a code length of the small block is 128. Two adjacent small blocks form one subblock, subblocks are only adjacently coupled in a group, and there is no coupling relationship between subblocks from different groups. If the overall code rate is ½, a total quantity of information bits is 512, and a quantity of information bits in each group is 512/2=256. Each group has 4 small blocks, and polarization exists between small blocks. Therefore, a quantity of information bits of each small block is different from each other. According to the foregoing code construction method, it may be determined that quantities of information bits of a first, a second, a third, and a fourth small block are 12, 72, 80, and 92 respectively. In this case, a quantity of information bits of a subblock 1 is 12+72=84, a quantity of information bits of a subblock 2 is 72+80=152, and a quantity of information bits of a subblock 3 is 80+92=172.

Optionally, code rates of two adjacent second subblocks in the first to-be-encoded vector may be consistent, and the first to-be-encoded vector includes at least two different code rates. The sending device may determine the code rate of each second subblock based on the quantity of second subblocks included in the first to-be-encoded vector and the overall code rate.

Based on the foregoing example, the relationship among the overall code rate, the quantity of second subblocks, and the code rate of each second subblock may be determined by an overall code length, a total information length, an overall code rate, a quantity of small blocks, a quantity of groups, a quantity of second subblocks in each group, and an information length of each small block. For details, see Table 1 to Table 9 below.

TABLE 10

4 small blocks in total are divided into 1 group with each group of 3 second subblocks

| | | | |
|---|---|---|---|
| Overall code length N | | 512 | |
| Total information length K | 256 | 384 | 448 |
| Overall code rate R | ½ | ¾ | ⅞ |
| Information length of a small block 1 | 12 | 48 | 81 |
| Information length of a small block 2 | 72 | 107 | 121 |
| Information length of a small block 3 | 80 | 112 | 122 |
| Information length of a small block 4 | 92 | 117 | 124 |

TABLE 11

4 small blocks in total are divided into 1 group with each group of 3 second subblocks

| | | | |
|---|---|---|---|
| Overall code length N | | 4096 | |
| Total information length K | 2048 | 3072 | 3584 |
| Overall code rate R | ½ | ¾ | ⅞ |
| Information length of a small block 1 | 95 | 381 | 645 |
| Information length of a small block 2 | 575 | 865 | 968 |
| Information length of a small block 3 | 639 | 893 | 978 |
| Information length of a small block 4 | 739 | 933 | 993 |

TABLE 12

4 small blocks in total are divided into 1 group with each group of 3 second subblocks

| | | | |
|---|---|---|---|
| Overall code length N | | 16384 | |
| Total information length K | 8192 | 12288 | 14336 |
| Overall code rate R | ½ | ¾ | ⅞ |
| Information length of a small block 1 | 362 | 1514 | 2571 |
| Information length of a small block 2 | 2311 | 3459 | 3876 |
| Information length of a small block 3 | 2547 | 3577 | 3917 |
| Information length of a small block 4 | 2972 | 3738 | 3972 |

TABLE 13

8 small blocks in total are divided into 2 group with each group of 3 second subblocks

| | | | |
|---|---|---|---|
| Overall code length N | | 1024 | |
| Total information K | 512 | 768 | 896 |
| Overall code rate R | ½ | ¾ | ⅞ |
| Information length of a small block 1 | 12 | 48 | 81 |
| Information length of a small block 2 | 72 | 107 | 121 |
| Information length of a small block 3 | 80 | 112 | 122 |
| Information length of a small block 4 | 92 | 117 | 124 |

TABLE 14

8 small blocks in total are divided into 2 group with each group of 3 second subblocks

| | | | |
|---|---|---|---|
| Overall code length N | | 8192 | |
| Total information length K | 4096 | 6144 | 7168 |
| Overall code rate R | ½ | ¾ | ⅞ |
| Information length of a small block 1 | 95 | 381 | 645 |
| Information length of a small block 2 | 575 | 865 | 968 |
| Information length of a small block 3 | 639 | 893 | 978 |
| Information length of a small block 4 | 739 | 933 | 993 |

TABLE 15

8 small blocks in total are divided into 2 group with each group of 3 second subblocks

| | | | |
|---|---|---|---|
| Overall code length N | | 32768 | |
| Total information length K | 16384 | 24576 | 28672 |
| Overall code rate R | ½ | ¾ | ⅞ |
| Information length of a small block 1 | 362 | 1514 | 2571 |
| Information length of a small block 2 | 2311 | 3459 | 3876 |
| Information length of a small block 3 | 2547 | 3577 | 3917 |
| Information length of a small block 4 | 2972 | 3738 | 3972 |

TABLE 16

8 small blocks in total are divided into 1 group with each group of 7 second subblocks

| | | | |
|---|---|---|---|
| Overall code length N | | 1024 | |
| Total information length K | 512 | 768 | 896 |
| Overall code rate R | ½ | ¾ | ⅞ |
| Information length of a small block 1 | 2 | 24 | 57 |
| Information length of a small block 2 | 61 | 99 | 118 |
| Information length of a small block 3 | 63 | 101 | 118 |
| Information length of a small block 4 | 66 | 102 | 119 |
| Information length of a small block 5 | 70 | 105 | 120 |
| Information length of a small block 6 | 74 | 108 | 120 |
| Information length of a small block 7 | 83 | 112 | 121 |
| Information length of a small block 8 | 93 | 117 | 123 |

TABLE 17

8 small blocks in total are divided into 1 group with each group of 7 second subblocks

| | | | |
|---|---|---|---|
| Overall code length N | | 8192 | |
| Total information length K | 4096 | 6144 | 7168 |
| Overall code rate R | ½ | ¾ | ⅞ |
| Information length of a small block 1 | 16 | 181 | 459 |
| Information length of a small block 2 | 502 | 798 | 935 |

TABLE 17-continued 8 small blocks in total are divided into 1 group with each group of 7 second subblocks

| | | | |
|---|---|---|---|
| Information length of a small block 3 | 514 | 808 | 942 |
| Information length of a small block 4 | 527 | 825 | 947 |
| Information length of a small block 5 | 553 | 841 | 956 |
| Information length of a small block 6 | 591 | 865 | 964 |
| Information length of a small block 7 | 647 | 893 | 974 |
| Information length of a small block 8 | 746 | 933 | 991 |

TABLE 18

8 small blocks in total are divided into 1 group with each group of 7 second subblocks

| | | | |
|---|---|---|---|
| Overall code length N | | 32768 | |
| Total information length K | 16384 | 24576 | 28672 |
| Overall code rate R | ½ | ¾ | ⅞ |
| Information length of a small block 1 | 57 | 709 | 1808 |
| Information length of a small block 2 | 2018 | 3190 | 3744 |
| Information length of a small block 3 | 2056 | 3241 | 3769 |
| Information length of a small block 4 | 2116 | 3299 | 3794 |
| Information length of a small block 5 | 2210 | 3369 | 3824 |
| Information length of a small block 6 | 2350 | 3456 | 3863 |
| Information length of a small block 7 | 2583 | 3575 | 3907 |
| Information length of a small block 8 | 2994 | 3737 | 3963 |

Based on the foregoing grouping and code rate matching of the to-be-encoded information bits and the constructed first generator matrix, an encoding manner in this embodiment of this application has a gain of 0.3 dB to 1 dB compared with that of an uncoupling code.

In an adjacently coupled or tail biting coupled 1-pass matrix, because only hard bits are used for decoupling instead of LLR decoupling, each subblock has same input LLR reliability, and a polar code construction of a subblock is the same as that of a common polar code.

In an adjacently coupled or tail biting coupled 2-pass matrix, reliability of each subchannel is different. Therefore, a construction method is different from that in the 1-pass matrix. First, overall input reliability of the subblock is calculated to obtain a code rate of each subblock. Equivalently, a quantity of information bits of each subblock may be obtained. Then, reliability of each subchannel in the subblock is calculated. This part is the same as a construction method of an original polar code.

In a possible implementation, an adjacent coupling scheme has better performance in a high code rate region, while a triangular coupling scheme has better performance in a low code rate region. Therefore, Rth may be used as a boundary to determine which coupling scheme is used when the code rate is less than or equal to Rth or is greater than or equal to Rth. For example, when the code rate R<Rth or R≤Rth, the triangular coupling scheme may be used, and when the code rate R≥Rth or R>Rth, the adjacent coupling/ tail biting coupling scheme may be used. Rth may be defined as an intermediate code rate such as ½, 7/16, 9/16, ⅜, or ⅝.

Figure 12A:
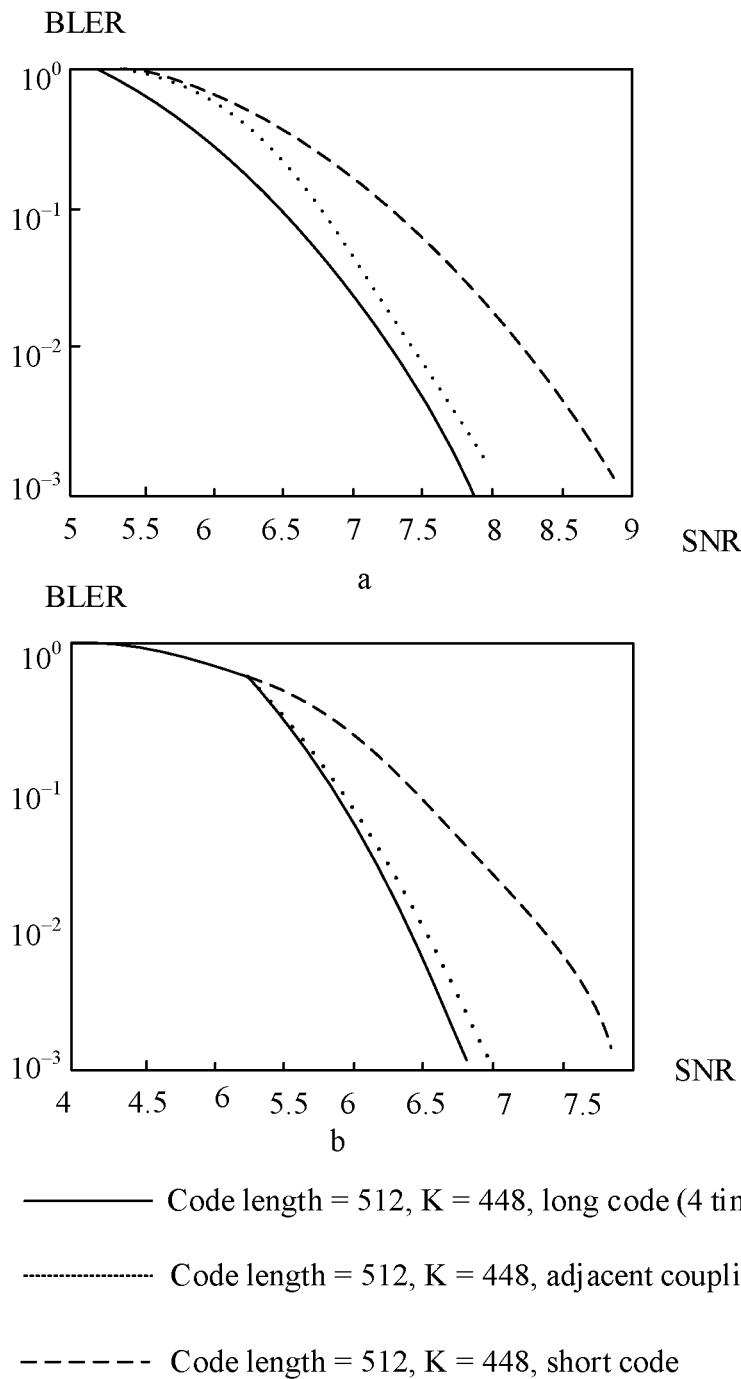
FIG. 12A is a schematic diagram of decoding performance according to an embodiment of this application.

FIG. 12A is a simulation effect diagram of different encoding manners. In FIG. 12A, an SC decoding method is used in figure a, and an SCL decoding manner is used in figure b. Figure a is used as an example, where a horizontal axis indicates a signal to noise ratio (SNR), and a vertical axis indicates a block error rate (BLER). The figure is expressed in EsNo, namely, a logarithmic form of a power ratio of a transmitted symbol to noise, which is in a unit of dB. It can be learned that, in a case of a same signal to noise ratio, a bit error rate of a long code is the lowest, a bit error rate of the encoding manner in this embodiment of this application is slightly higher than a bit error rate of a long code, and a bit error rate of a short code is the highest. However, because complexity of the long code is high, the encoding manner provided in this embodiment of this application can reduce the complexity, and can also increase the encoding gain. In FIG. 12A, the overall code length N=514, and the total information length K=448. According to the encoding manner provided in this embodiment of this application, when decoding is performed by using the SCL, the bit error rate is slightly different from that of the long code. Compared with the SC decoding, the SCL decoding can further reduce the bit error rate.

Figure 12B:
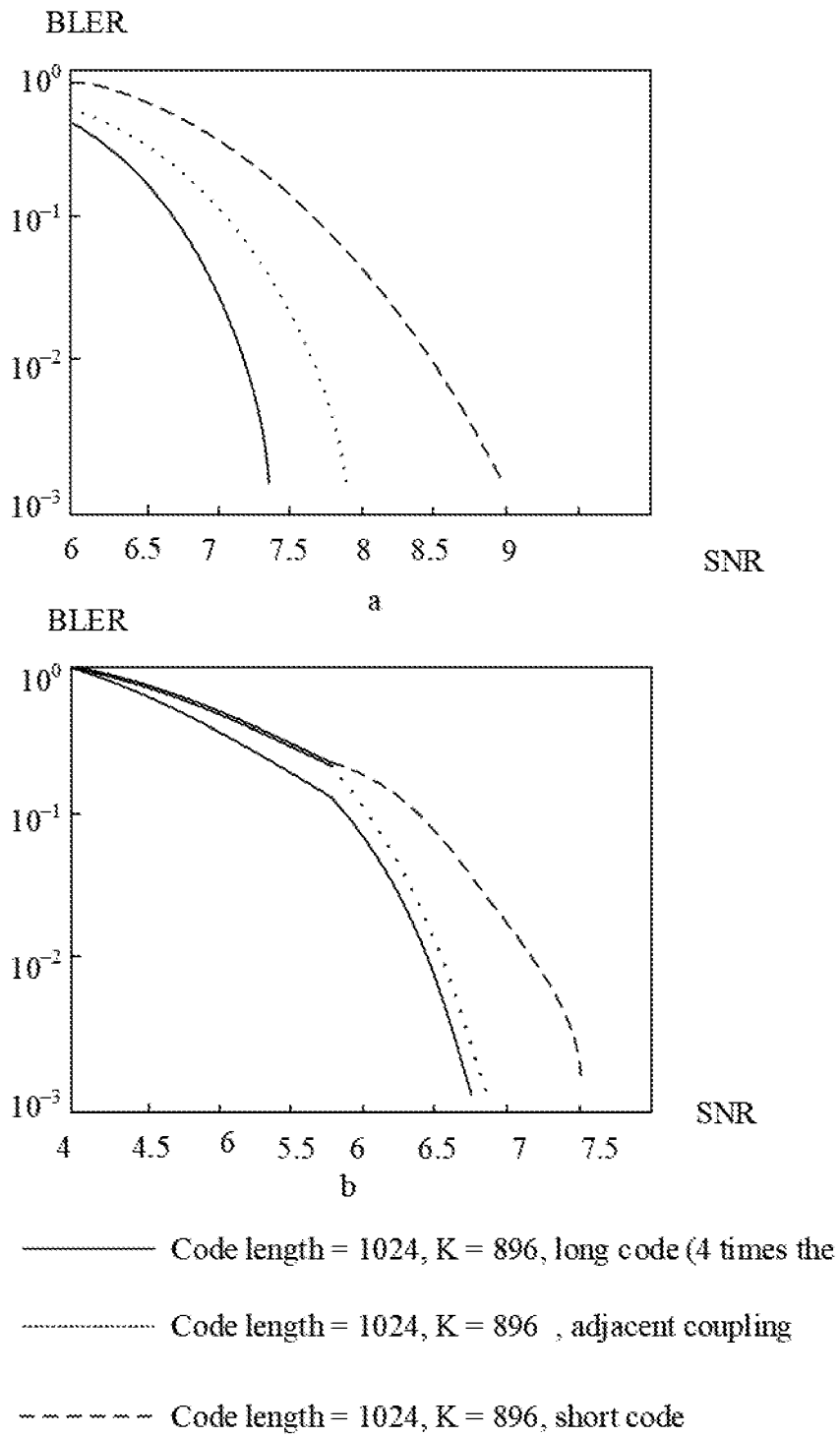
FIG. 12B is a schematic diagram of decoding performance according to an embodiment of this application.

FIG. 12B is a simulation effect diagram of different encoding manners. In FIG. 12B, an SC decoding method is used in figure a, and an SCL decoding manner is used in figure b. Figure a is used as an example, where a horizontal axis indicates a signal to noise ratio (SNR), and a vertical axis indicates a block error rate (BLER). The figure is expressed in EsNo, namely, a logarithmic form of a power ratio of a transmitted symbol to noise, which is in a unit of dB. It can be learned that, in a case of a same signal to noise ratio, a bit error rate of a long code is the lowest, a bit error rate of the encoding manner in this embodiment of this application is slightly higher than a bit error rate of a long code, and a bit error rate of a short code is the highest. However, because complexity of the long code is high, the encoding manner provided in this embodiment of this application can reduce the complexity, and can also increase the encoding gain. In FIG. 12A, the overall code length N=1024, and the total information length K=896. Compared with the SC decoding, the SCL decoding can further reduce the bit error rate.

It can be learned from FIG. 12A and FIG. 12B that, in a case of a same code rate, a bit error rate of a triangular coupling matrix encoding manner provided in this embodiment of this application is obviously lower than that of the short code, and is slightly different from a bit error rate of the long code, but complexity of the triangular coupling matrix encoding manner is lower than that of the long code.

Step 304: The sending device sends the encoded codeword to a receiving device, and correspondingly, the receiving device receives the codeword from the sending device.

Step 305: The receiving device decodes the codeword.

When decoding the codeword, the receiving device may decode the codeword based on the first generator matrix. Optionally, the receiving device may decode the codeword by using different first generator matrixes based on different encoding manners. Decoding is described in the following 4 cases based on the different encoding manners.

Case 1: 1-Pass Decoding of the Triangular Coupling Matrix.

The 1-pass decoding of the triangular coupling matrix may include the following two characteristics:

1. The LLR does not need to be passed within a total transmission length range, and only a part of the LLR needs to be copied between adjacent subblocks.
2. Lower-latency window decoding is supported: the LLR is received, and decoding is performed at the same time, to have lower complexity.

During hard decoupling of the triangular coupling matrix, decoding results of all previous subblocks need to be used to write a to-be-decoded LLR of a current subblock. If an exclusive OR value of an $i^{th}$ bit of all the previous subblocks is 0, an LLR received on an $i^{th}$ channel of the current subblock is directly sent to a decoder of the current subblock. If the exclusive OR value of the $i^{th}$ bit of all the previous subblocks is 1, a symbol of the LLR received on the $i^{th}$ channel of the current subblock is negated or multiplied by −1, and then is sent to the decoder of the current subblock.

Figure 13A:
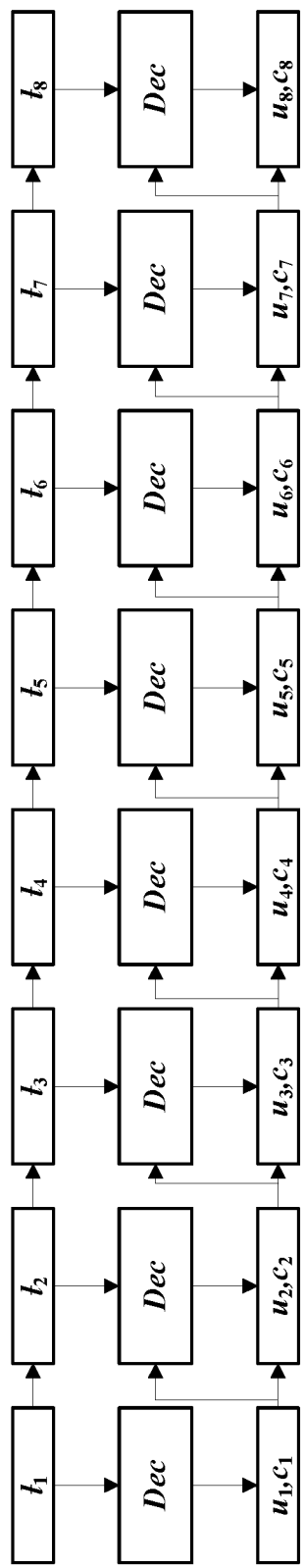
FIG. 13A is a schematic diagram of a decoding process according to an embodiment of this application.

In an example, the decoding manner may be shown in FIG. 13A. First, inter-subblock codeword hard decoupling is performed. It should be understood that the $1^{st}$ subblock does not require the codeword hard decoupling. A meaning of the inter-subblock codeword hard decoupling is: writing a to-be-decoded LLR of a current subblock by using a decoding result of a previous subblock.

It is assumed that the current subblock is a $t^{th}$ subblock, the exclusive OR value of the $i^{th}$ bit of all the previous subblocks is $x_{t-1,i}=c_{1,i}+c_{2,i}+\ldots+c_{t-1,i}$, and an $i^{th}$ value of an LLR output from a channel of the current subblock is $l_{t,i}$. In this case, an $i^{th}$ LLR value sent to the decoder of the current subblock is $l_{t,i}=(1-2x_{t-1,i})l_{t,i}$. This process repeats until a last subblock is decoded.

Case 2: 2-Pass Decoding of the Triangular Coupling Matrix.

The 2-pass decoding of the triangular coupling matrix may include the following two characteristics:
1. LLR pass (backward-pass) is required on the total transmission length, and then decoding results of subblocks are passed (forward-pass) one by one.
2. A polarization phenomenon may be formed between subblocks, so as to obtain a part of a long code gain as much as possible.

However, because the triangular coupling matrix is different from the adjacent coupling matrix, decoding methods thereof are also different, as shown in the following figure.

Figure 13B:
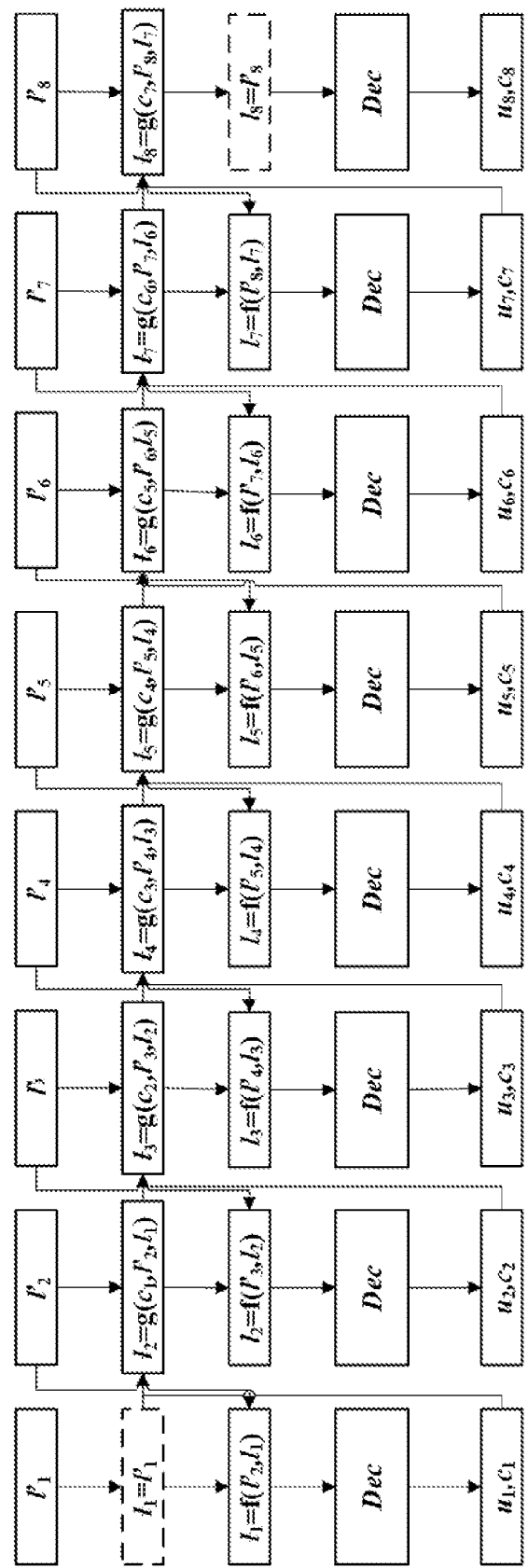
FIG. 13B is a schematic diagram of a decoding process according to an embodiment of this application.

In an example, the decoding manner may be shown in FIG. 13B. First, forward-pass of inter-subblock codeword soft decoupling is performed. It should be understood that the last subblock does not require the codeword soft decoupling. It is assumed that an $i^{th}$ codeword bit of a previous subblock is $c_{t-1,i}$, an $i^{th}$ value of a forward decoupling LLR of the previous subblock is $l_{t-1,i}$, and an $i^{th}$ value of an LLR received on a channel of the current subblock is $l'_{t,i}$. In this case, an $i^{th}$ value of a forward decoupling LLR of the current subblock is $l_{t,i}=g(c_{t-1,i},l_{t-1,i},l'_{t,i})$. It is assumed that the $i^{th}$ value of the forward decoupling LLR of the current subblock is $l_{t,i}=g(c_{t-1,i},l_{t-1,i},l'_{t,i})$, and an $i^{th}$ value of an LLR received on a channel of a next subblock is $l'_{t+1,i}$. In this case, an $i^{th}$ value of a backward decoupling LLR of the subblock is $l_{t,i}=f(l_{t,i},l'_{t+1,i})$. The backward decoupling LLR of the current subblock is sent to the decoder of the current subblock, and this process repeats until the last subblock is decoded.

Case 3: 1-Pass Decoding of the Adjacently Coupled and the Tail Biting Coupled Matrix.

The 1-pass decoding of the adjacently coupled and the tail biting coupled matrix may include the following two characteristics:

1. The LLR does not need to be passed within a total transmission length range, and only a part of the LLR needs to be copied between adjacent subblocks.
2. Lower-latency window decoding is supported: the LLR is received, and decoding is performed at the same time, to have lower complexity.

In an example, the decoding manner may be shown in FIG. 13A. First, inter-subblock codeword hard decoupling is performed. It should be understood that the $1^{st}$ subblock does not require the codeword soft decoupling. It is assumed that an $i^{th}$ bit of a previous subblock is ci, and an $i^{th}$ value of an LLR output from the channel of the current subblock is li. In this case, the $i^{th}$ value sent to the decoder of the current subblock is $_i=(1-2c_i)l_i$. This process repeats until the last subblock is decoded. If the $i^{th}$ bit of the previous subblock is 0, an LLR received on an $i^{th}$ channel of the current subblock is directly sent to the decoder of the current subblock. If the $i^{th}$ bit of the previous subblock is 1, a symbol of the LLR received on the $i^{th}$ channel of the current subblock is negated or multiplied by −1, and then is sent to the decoder of the current subblock.

Case 4: 2-Pass Decoding of the Adjacently Coupled and the Tail Biting Coupled Matrix.

The 2-pass decoding of the adjacently coupled and the tail biting coupled matrix may include the following two characteristics:
1. LLR pass (backward-pass) is required on the total transmission length, and then decoding results of subblocks are passed (forward-pass) one by one.
2. A polarization phenomenon may be formed between subblocks, so as to obtain a part of a long code gain as much as possible.

In an example, the decoding manner may be shown in FIG. 13B. First, backward-pass of inter-subblock codeword soft decoupling is performed. It should be understood that the last subblock does not require the codeword soft decoupling. It is assumed that the $i^{th}$ value of the LLR received on the channel of the current subblock is $l'_{t,i}$, and the $i^{th}$ value of the LLR received on the channel of the next subblock is $l'_{t+1,i}$. In this case, the $i^{th}$ value of the backward decoupling LLR of the subblock $l_{t,i}=f(l'_{t,i},l'_{t+1,i})$. It is assumed that the $i^{th}$ codeword bit of the previous subblock is $c_{t-1,i}$, an $i^{th}$ value of an LLR received on a channel of the previous subblock is and an $i^{th}$ value of the backward decoupling LLR of the current subblock is $l_{t,i}$. In this case, an $i^{th}$ value of the forward decoupling LLR is $l_{t,i}=g(c_{t-1,i},l'_{t-1,i},l_{t,i})$. The forward decoupling LLR of the current subblock is sent to the decoder of the current subblock, and this process repeats until the last subblock is decoded.

In a possible implementation, the sending device and the receiving device may separately determine a type of an outer code, an outer-code polynomial, a quantity of outer-code groups, a coupling degree, a quantity of coupling groups, a coupling relationship, selection of a coupling matrix, and other coupling-related parameters. The coupling-related parameter may be determined by a scenario, a codeword parameter, and the like.

Optionally, the sending device or the receiving device may first determine a specific coupling scheme based on a parameter such as a code length or an application scenario, including coupling-related parameters such as an outer code, a quantity of groups, a coupling degree, and a coupling manner that are shown above. The sending device may negotiate the foregoing coupling-related parameters with the receiving device by using signaling, or the sending device may indicate the coupling-related parameter to the receiving device, or the receiving device may indicate the coupling-related parameter to the sending device. Optionally, the coupling-related parameter may also be specified in a communication protocol. This is not specifically limited in this application. Then, the sending and receiving parties perform encoding and decoding communication in an agreed manner.

In an example, the sending device and the receiving device may negotiate or indicate the coupling-related parameter by using a radio resource control (RRC) message. Optionally, some fields may be added to the RRC message to carry encoding configuration information. The encoding configuration information may include the foregoing plurality of coupling-related parameters.

In another example, the sending device or the receiving device may indicate the coupling-related parameter by using downlink control information (DCI). Optionally, a format of the DCI may be shown in Table 19.

TABLE 19

| DCI | | |
|---|---|---|
| Field | Bits | Ref. |
| Polynomial | 16 | 0 × 10811 |
| Coupling | 1 | 2 |
| Group number | 1 | 2 |
| Group size | 3 | 8 |
| Coupling matrix | 2 | 'Upper triangle' |

Figure 14:
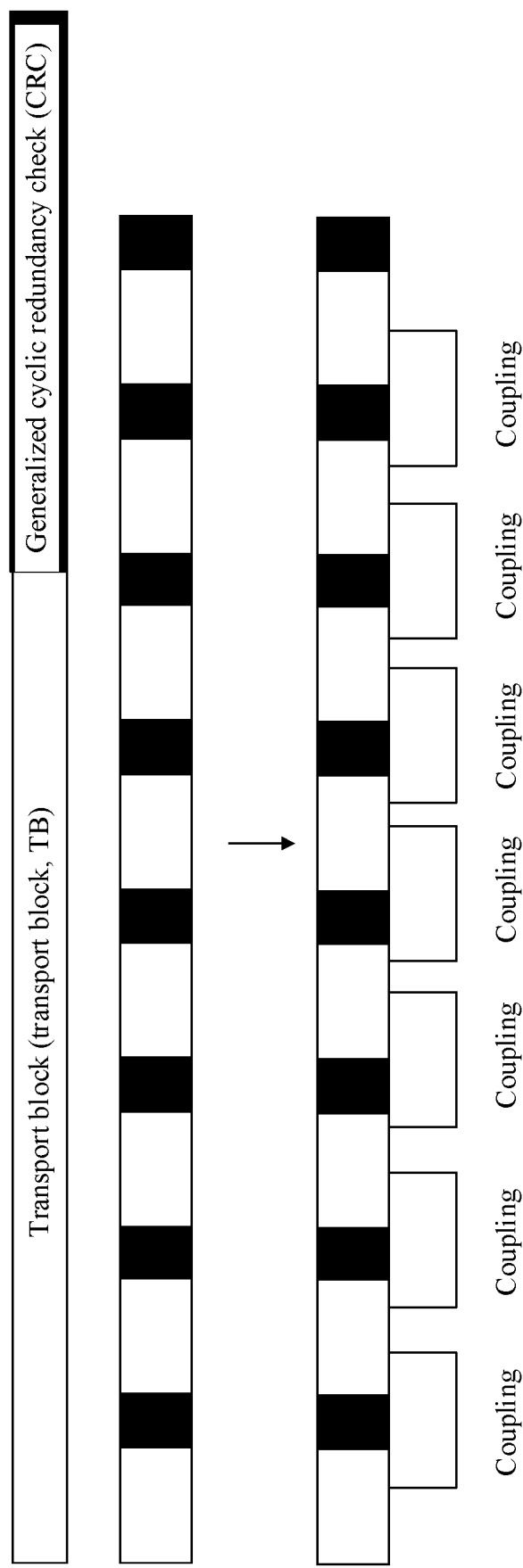
FIG. 14 is a schematic diagram of a coupling relationship of a transport block according to an embodiment of this application.

In a possible implementation, to-be-encoded bits may be divided into several groups, and each group includes a specified quantity of code blocks (CB). There may be a coupling relationship between code blocks in each group, as shown in FIG. 14. For the coupling relationship between code blocks, refer to related descriptions in the foregoing three encoding manners. FIG. 14 shows only an example of a coupling manner.

In an example, if a quantity B of to-be-encoded bits is greater than a threshold Reb, the B to-be-encoded bits are segmented (segmentation), and a CRC belonging to the CB is added to each segment of information bits. It is assumed that a CRC length is L, and L>0. A quantity of to-be-encoded bits to which CRC bits are added is B', and a procedure is as follows.

```
If B <= K_cb
  CRC length = 0
  Quantity of CBs: C = 1
  B' = B
  Encoding: B' information bit → N codeword bit
Else
  CRC length = L
  Quantity of CBs: C = [B/(Kcb - L)]
  B' = B + quantity of CBs × L
  For r = 0:C-1
    Perform intra-subblock encoding on an r^th CB: c_r = CB_encode(u_r)
  End for
  For r = 0:C-1
    Perform inter-subblock (coupling) encoding on the r^th CB: c'_r = Couple_encode(c_r, c_r1, c_r2, ..., c_rl)
    (c_r1, c_r2, ..., c_rl) are subblocks that have the coupling relationship with the r^th CB
  End for
  c'2 = couple_encode(c_2,c_1) = c_2 + c_1
End if
```

After segmentation, segment-c information vectors $u_0, u_1, \ldots, u_{c-1}$, are respectively encoded, and obtained codeword vectors are $c_0, c_1, \ldots, c_{c-1}$, where a codeword bit of the $r^{th}$ CB is $c_r = [c_{r0}, c_{r1}, \ldots, c_{r(Nr-1)}]$, and Nr is a quantity of bits of a subblock codeword of the $r^{th}$ CB. Then, inter-subblock encoding is performed on C CBs, and obtained codeword vectors are $c'_0, c'_1, \ldots, c'_{c-1}$, where the codeword bit of the $r^{th}$ CB is $c'_r = [c'_{r0}, c'_{r1}, \ldots, c'_{r*Mr-1}]$, and Mr is a quantity of bits of a coupling codeword of the $r^{th}$ CB. $c_{r1}, c_{r2}, \ldots, c_{rl}$ are subblocks having the coupling relationship with the $r^{th}$ CB, and therefore, the coupling codeword of the $r^{th}$ CB is generated by performing coupling encoding on subblock codewords of an $r_{rth}, r_{2th}, \ldots, r_{lth}$ CB. r described above is greater than or equal to 1.

In another example, if the quantity B of to-be-encoded bits is greater than a threshold $K_{cb}$, the B to-be-encoded bits are segmented (segmentation), and a CRC belonging to the CB is added to each segment of information bits. It is assumed that a CRC length is L, and L>0. A quantity of to-be-encoded bits to which CRC bits are added is B', and a procedure is as follows.

```
If B <= K_cb
    CRC length = 0
    Quantity of CBs: C = 1
    B' = B
    Encoding: B' information bit → N codeword bit
Else
    CRC length = L
    Quantity of CBs: C = [B/(Kcb − L)]
    B' = B + quantity of CBs × L
    Code rate (information bit) allocation is performed on the C CBs: {K_1, K_2, ..., K_c} =
Rate_allocation(B',C)
    For r = 0:C-1
        Perform intra-subblock encoding on the r^th CB: c_r = CB_encode(u_r) c'_3 =
couple_encode(c_3, c_2, c_1) = c_3 + c_2 + c_1
    End for
    For r = 0:C-1
        Perform inter-subblock (coupling) encoding on the r^th CB: c'_r = Couple_encode(c_r, c_r1,
c_r2, ..., c_rl)
        (c_r1, c_r2, ..., c_rl are subblocks that have the coupling relationship with the r^th CB)
    End for
End if
```

After segmentation, code rate (information bit) allocation is first performed on the C CBs, to obtain quantities of information bits of all subblocks, which are $K_1, K_2, \ldots, K_C$ respectively, where a quantity of information bits of the $r^{th}$ CB is $K_r$. $K_r$ may include a CRC bit or may not include the CRC bit. $K_1+K_2+\ldots,+K_C=B'$. After the segment-c information vectors $u_1, u_1, \ldots, u_{C-1}$ are respectively encoded, the obtained codeword vectors are $c_0, c_1, \ldots, c_{C-1}$, where the codeword bit of the $r^{th}$ CB is $c_r=[c_{r0}, c_{r1}, \ldots, c_{r(Nr-1)}]$, and Nr is the quantity of bits of the subblock codeword of the $r^{th}$ CB. Then, inter-subblock encoding is performed on C CBs, and obtained codeword vectors are $c'_0, c'_1, \ldots, c'_{c-1}$, where the codeword bit of the $r^{th}$ CB is $c'_r=[c'_{r0}, c'_{r1}, \ldots, c'_{r(Mr-1)}]$, and Mr is a quantity of bits of a coupling codeword of the $r^{th}$ CB. $c_{r1}, c_{r2}, \ldots, c_{rl}$ are subblocks having the coupling relationship with the $r^{th}$ CB, and therefore, the coupling codeword of the $r^{th}$ CB is generated by performing coupling encoding on subblock codewords of an $r_{1th}, r_{2th}, \ldots, r_{lth}$ CB.

Figure 15:
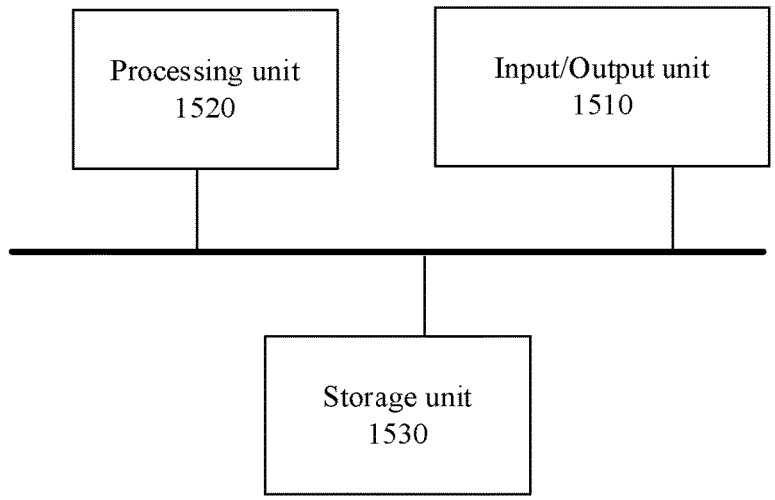
FIG. 15 is a schematic diagram of a structure of an apparatus according to an embodiment of this application.

Based on a same technical idea as the foregoing communication method, as shown in FIG. 15, an apparatus 1500 is provided. The apparatus 1500 may include a processing unit 1520 and an input/output unit 1510. Optionally, a storage unit 1530 is further included. The processing unit 1520 may be separately connected to the storage unit 1530 and the input/output unit 1510, and the storage unit 1530 may also be connected to the input/output unit 1510. The processing unit 1520 may be integrated with the storage unit 1530. The input/output unit 1510 may also be referred to as a transceiver, a transceiver machine, a transceiver apparatus, or the like. The processing unit 1520 may also be referred to as a processor, a processing board, a processing module, a processing apparatus, or the like. Optionally, a component that is in the input/output unit 1510 and that is configured to implement a receiving function may be considered as a receiving unit, and a component that is in the input/output unit 1510 and that is configured to implement a sending function may be considered as a sending unit. In other words, the input/output unit 1510 includes the receiving unit and the sending unit. The input/output unit may also be sometimes referred to as a transceiver machine, a transceiver, a transceiver circuit, or the like. The receiving unit sometimes may also be referred to as a receiver, a receiver machine, a receiver circuit, or the like. The sending unit sometimes may also be referred to as a transmitter, a transmitter machine, a transmitter circuit, or the like.

It should be understood that the input/output unit 1510 is configured to perform sending and receiving operations of the sending device and the receiving device in the foregoing method embodiments, and the processing unit 1520 is configured to perform an operation other than the sending and receiving operations on the sending device and the receiving device in the foregoing method embodiments. For example, in an implementation, the input/output unit 1510 is configured to perform a sending operation of the sending device and a receiving operation of the receiving device shown in step 304 of FIG. 3. And/or the input/output unit 1510 is further configured to perform other receiving and sending steps of the sending device and the receiving device in embodiments of this application. The processing u nit 1520 is configured to perform processing steps of the sending device shown in step 301 to step 303 and processing operations of the receiving device shown in step 305 of FIG. 3, and/or the processing unit 1520 is configured to perform other processing steps of the sending device and the receiving device in embodiments of this application.

It should be noted that the encoding apparatus shown in this embodiment of this application may implement the technical solutions shown in the foregoing method embodiments. Implementation principles and beneficial effects thereof are similar to those of the method embodiments. Details are not described herein again.

The storage unit 1530 is configured to store a computer program.

For example, when the apparatus 1500 is configured to perform the step performed by the sending device, the processing unit 1520 is configured to obtain a first to-be-encoded vector; the processing unit 1520 is further configured to: perform first encoding on the first to-be-encoded vector, to obtain a second to-be-encoded vector; and perform second encoding on the second to-be-encoded vector based on a first generator matrix, to obtain an encoded codeword; and the input/output unit 1510 is configured to send the encoded codeword. For the first generator matrix, refer to related descriptions in the method embodiment shown in FIG. 3. Details are not described herein again.

In a possible implementation, the processing unit 1520 is further configured to: determine a quantity of second subblocks included in a to-be-encoded information bit; and determine, based on an overall code rate of the codeword and the quantity of second subblocks, a code rate of each second subblock included in the to-be-encoded information bit, where the second subblocks have different code rates; and when obtaining the first to-be-encoded vector, the processing unit 1520 is specifically configured to: determine the first to-be-encoded vector based on the code rate of each second subblock, where the first to-be-encoded vector includes q second subblocks, and q is an integer greater than 0.

For example, when the apparatus 1500 is configured to perform the steps performed by the receiving device, the input/output unit 1510 is configured to receive a codeword; and the codeword is obtained by encoding based on a first generator matrix. The processing unit 1520 is configured to decode the codeword. For the first generator matrix, refer to related descriptions in the method embodiment shown in FIG. 3. Details are not described herein again.

Figure 16:
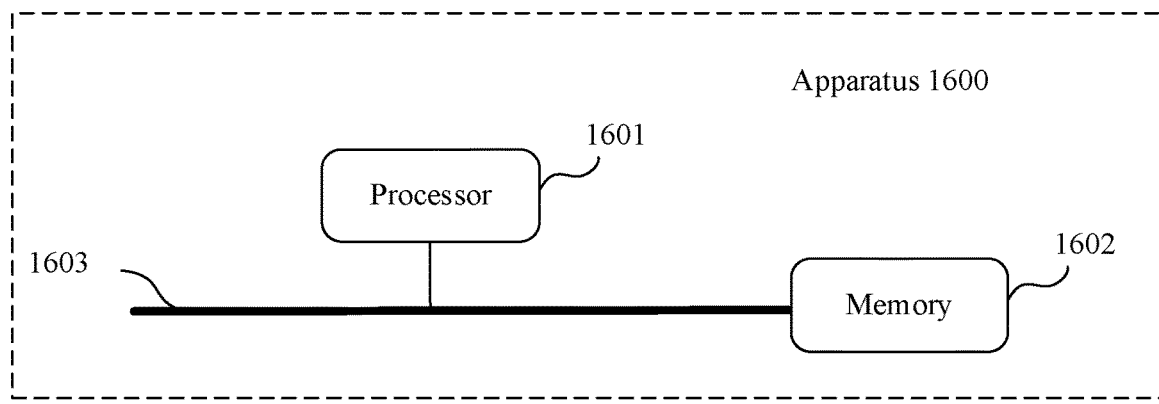
FIG. 16 is a schematic diagram of an encoding apparatus according to an embodiment of this application.

FIG. 16 is a schematic diagram of a hardware structure of an apparatus according to an embodiment of this application. The apparatus 1600 is configured to implement a function of the sending device in the foregoing method. When the apparatus is configured to implement the function of the sending device in the foregoing method, the apparatus may be a sending device, or may be a chip having a function similar to that of the sending device, or an apparatus that can be used in a matching manner with the sending device. The apparatus 1600 includes a processor 1601 and a memory 1602.

The memory 1602 is configured to store a computer program, and may be further configured to store intermediate data.

The processor 1601 is configured to execute the computer program stored in the memory, to implement the steps in the foregoing encoding methods. For details, refer to related description in the foregoing method embodiments.

Optionally, the memory 1602 may be independent, or may be integrated with the processor 1601. In some implementations, the memory 1602 may even be located outside the encoding apparatus 1600.

When the memory 1602 is a device independent of the processor 1601, the encoding apparatus 1600 may further include a bus 1603 configured to connect the memory 1602 and the processor 1601.

Optionally, the apparatus 1600 may further include a transmitter. For example, the transmitter is configured to send encoded bits.

The apparatus 1600 provided in this embodiment may be a terminal device or a network device, and may be configured to perform the foregoing encoding methods. Implementations and technical effects thereof are similar to those of the encoding methods. Details are not described herein again in this embodiment.

Figure 17:
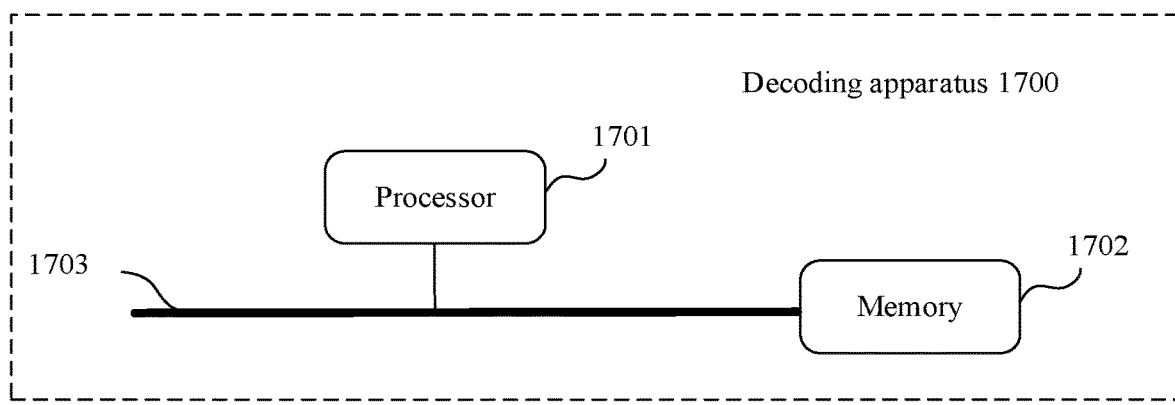
FIG. 17 is a schematic diagram of a decoding apparatus according to an embodiment of this application.

FIG. 17 is a schematic diagram of a hardware structure of an apparatus according to an embodiment of this application. The apparatus 1700 is configured to implement a function of the receiving device in the foregoing method. When the apparatus is configured to implement the function of the receiving device in the foregoing method, the apparatus may be a receiving device, or may be a chip having a function similar to that of the receiving device, or an apparatus that can be used in a matching manner with the receiving device. The apparatus 1700 includes a processor 1701 and a memory 1702.

The memory 1702 is configured to store a computer program, and may be further configured to store intermediate data.

The processor 1701 is configured to execute the computer program stored in the memory, to implement the steps in the foregoing encoding methods. For details, refer to related description in the foregoing method embodiments.

Optionally, the memory 1702 may be independent, or may be integrated with the processor 1701. In some implementations, the memory 1702 may even be located outside the encoding apparatus 1700.

When the memory 1702 is a device independent of the processor 1701, the encoding apparatus 1700 may further include a bus 1703 configured to connect the memory 1702 and the processor 1701.

Optionally, the apparatus 1700 may further include a receiver. For example, the receiver is configured to receive encoded bits.

The apparatus 1700 provided in this embodiment may be a terminal device or a network device, and may be configured to perform the foregoing encoding methods. Implementations and technical effects thereof are similar to those of the encoding methods. Details are not described herein again in this embodiment.

Figure 18:
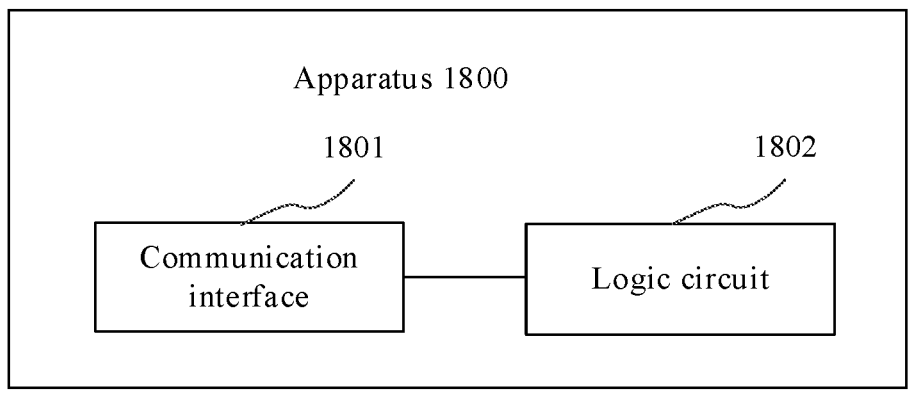
FIG. 18 is a schematic diagram of an encoding apparatus according to an embodiment of this application.

FIG. 18 is a schematic diagram of a structure of an apparatus according to an embodiment of this application. Refer to FIG. 18, the apparatus 1800 may include a communication interface 1801 and a logic circuit 1802.

The logic circuit 1802 is configured to: obtain a first to-be-encoded vector; perform first encoding on the first to-be-encoded vector, to obtain a second to-be-encoded vector; and perform second encoding on the second to-be-encoded vector based on a first generator matrix, to obtain an encoded codeword, where the first generator matrix includes at least N+1 submatrices a, N submatrices are located on a main diagonal of the first generator matrix, and the first generator matrix is a block upper triangular matrix, or the first generator matrix is a block lower triangular matrix, where a is a polar kernel matrix with a size of $2^m*2^m$, m is a natural number, and N is a natural number; and the communication interface is configured to output the encoded codeword.

Optionally, the communication interface 1801 may have a function of the input/output unit 1510 in the embodiment shown in FIG. 15. The logic circuit 1802 may have a function of the processing unit 1520 in the embodiment shown in FIG. 15.

Optionally, the logic circuit 1802 may have a function of the processor 1601 in the embodiment shown in FIG. 16. The logic circuit 1802 may further perform other steps in the encoding method.

The apparatus 1800 provided in this embodiment of this application may implement the technical solutions shown in the foregoing method embodiments. Implementation principles and beneficial effects thereof are similar to the method embodiments. Details are not described herein again.

Figure 19:
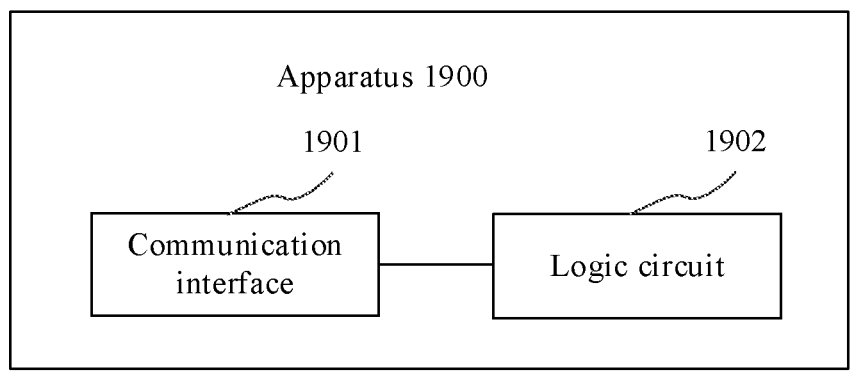
FIG. 19 is a schematic diagram of a decoding apparatus according to an embodiment of this application.

FIG. 19 is a schematic diagram of a structure of another apparatus according to an embodiment of this application. Refer to FIG. 19, the apparatus 1900 may include a communication interface 1901 and a logic circuit 1902.

The communication interface 1901 is configured to input an encoded codeword.

The logic circuit 1902 is configured to decode the codeword.

Optionally, the communication interface 1901 may have a function of the input/output unit 1510 in the embodiment shown in FIG. 15. The logic circuit 1902 may have a function of the processing unit 1520 in the embodiment shown in FIG. 15.

Optionally, the communication interface 1901 may have a function of the receiver in the embodiment shown in FIG. 17. The logic circuit 1902 may have a function of the processor 1701 in the embodiment shown in FIG. 17. The logic circuit 1902 may further perform other steps in the decoding method.

Optionally, the communication interface 1901 may further output a decoding result.

The apparatus 1900 provided in this embodiment of this application may implement the technical solutions shown in the foregoing method embodiments. Implementation principles and beneficial effects thereof are similar to the method embodiments. Details are not described herein again.

In another form of this embodiment, a computer-readable storage medium is provided. The computer-readable storage medium stores instructions. When the instructions are executed, the method performed by the sending device and the receiving device in the foregoing method embodiments is performed.

In another form of this embodiment, a computer program product including instructions is provided. When the instructions are executed, the method performed by the sending device and the receiving device in the foregoing method embodiments is performed.

In another form of this embodiment, a communication system is provided. The system may include the foregoing at least one sending device and the foregoing at least one receiving device.

It should be understood that the processor mentioned in embodiments of the present invention may be a central processing unit (CPU), or may be another general purpose processor, a digital signal processor (DSP), an application-specific integrated circuit (ASIC), a field programmable gate array (FPGA) or another programmable logic device, a discrete gate or transistor logic device, a discrete hardware component, or the like. The general-purpose processor may be a microprocessor, or the processor may be any conventional processor or the like.

It should also be understood that the memory mentioned in embodiments of the present invention may be a volatile memory or a non-volatile memory, or may include a volatile memory and a non-volatile memory. The non-volatile memory may be a read-only memory (ROM), a programmable read-only memory (PROM), an erasable programmable read-only memory (EPROM), an electrically erasable programmable read-only memory (EEPROM) or a flash memory. The volatile memory may be a random access memory (RAM), used as an external cache. Through example but not limitative descriptions, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM).

It should be noted that when the processor is a general-purpose processor, a DSP, an ASIC, an FPGA, or another programmable logic device, discrete gate or transistor logic device, or discrete hardware component, the memory (a storage module) is integrated into the processor.

It should be noted that the memory described in this specification is intended to include but not limited to these memories and any memory of another proper type.

It should be understood that sequence numbers of the foregoing processes do not mean execution sequences in various embodiments of this application. The execution sequences of the processes should be determined according to functions and internal logic of the processes, and should not be construed as any limitation on the implementation processes of embodiments of the present invention.

A person of ordinary skill in the art may be aware that, in combination with examples described in the embodiments disclosed in this specification, units and algorithm steps may be implemented by electronic hardware or a combination of computer software and electronic hardware. Whether the functions are performed by hardware or software depends on particular applications and design constraints of the technical solution. A person skilled in the art may use different methods to implement the described functions for each particular application, but it should not be considered that the implementation goes beyond the scope of this application.

A person skilled in the art may clearly understand that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or another form.

The units described as separate parts may or may not be physically separate, and parts displayed as units may or may not be physical units, and may be located in one position, or may be distributed on a plurality of network units. All or a part of the units may be selected based on actual requirements to achieve the objectives of the solutions of the embodiments.

In addition, functional units in embodiments of this application may be integrated into one processing unit, each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods described in embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are only specific implementations of this application, but are not intended to limit the protection scope of this application. Any variation or replacement readily figured out by a person skilled in the art in the technical scope disclosed in this application shall fall in the protection scope of this application. Therefore, the protection scope of this application should be subject to the protection scope of the claims.

What is claimed is:

1. A method, comprising:
   obtaining, by a sending device, a first to-be-encoded vector;
   performing, by the sending device, first encoding on the first to-be-encoded vector, to obtain a second to-be-encoded vector;
   performing, by the sending device, second encoding on the second to-be-encoded vector based on a first generator matrix, to obtain an encoded codeword,
   wherein the first generator matrix comprises at least N+1 submatrices, N submatrices of the N+1 submatrices are located on a main diagonal of the first generator matrix,
   wherein the first generator matrix is a block upper triangular matrix, or the first generator matrix is a block lower triangular matrix, and
   wherein each submatrix (a) of the N+1 submatrices is a polar kernel matrix with a size of $2^m*2^m$, m and N are natural numbers; and
   sending, by the sending device, the encoded codeword.

2. The method according to claim 1, wherein upper triangular elements in the block upper triangular matrix are all a, and lower triangular elements in the block lower triangular matrix are all a.

3. The method according to claim 1, wherein the first generator matrix comprises K first subblocks, the K first subblocks are located on the main diagonal of the first generator matrix, adjacent first subblocks partially overlap, K is an integer greater than or equal to 2 and greater than or equal to N, and each subblock of the K first subblocks is $$\begin{bmatrix} a & 0 \\ a & a \end{bmatrix} \text{ or } \begin{bmatrix} a & a \\ 0 & a \end{bmatrix}.$$

4. The method according to claim 3, wherein an overlapping portion between the adjacent first subblocks is a.

5. The method according to claim 3, wherein the K first subblocks comprise the N submatrices, and when a first subblock of the K first subblocks is $$\begin{bmatrix} a & 0 \\ a & a \end{bmatrix},$$

one submatrix of the N submatrices is located in an upper right corner of the first generator matrix.

6. The method according to claim 3, wherein the K first subblocks comprise the N submatrices, and when a first subblock of the K first subblocks is $$\begin{bmatrix} a & a \\ 0 & a \end{bmatrix},$$

one submatrix of the N submatrices is located in a lower left corner of the first generator matrix.

7. The method according to claim 1, wherein the method further comprises:
   before the obtaining, by the sending device, the first to-be-encoded vector:
   determining, by the sending device, a quantity of second subblocks comprised in a to-be-encoded information bit;
   determining, by the sending device based on an overall code rate of the encoded codeword and the quantity of second subblocks, a corresponding code rate of each second subblock of the second subblocks comprised in the to-be-encoded information bit, wherein the second subblocks have different code rates; and
   determining, by the sending device, the first to-be-encoded vector based on the corresponding code rate of each second subblock, wherein the first to-be-encoded vector comprises q second subblocks, and q is an integer greater than 0.

8. A method, comprising:
   receiving, by a receiving device, a codeword, wherein the codeword is obtained by encoding based on a first generator matrix; and
   decoding, by the receiving device, the codeword based on the first generator matrix,
   wherein the first generator matrix comprises at least N+1 submatrices, N submatrices of the N+1 submatrices are located on a main diagonal of the first generator matrix,
   wherein the first generator matrix is a block upper triangular matrix, or the first generator matrix is a block lower triangular matrix, and
   wherein each submatrix (a) of the N+1 submatrices is a polar kernel matrix with a size of $2^m*2^m$, m and N are natural numbers.

9. The method according to claim 8, wherein upper triangular elements in the block upper triangular matrix are all a, and lower triangular elements in the block lower triangular matrix are all a.

10. The method according to claim 8, wherein the first generator matrix comprises K first subblocks, the K first subblocks are located on the main diagonal of the first generator matrix, adjacent first subblocks partially overlap, K is an integer greater than or equal to 2 and greater than or equal to N, and each subblock of the K first subblocks is $$\begin{bmatrix} a & 0 \\ a & a \end{bmatrix} \text{ or } \begin{bmatrix} a & a \\ 0 & a \end{bmatrix}.$$

11. The method according to claim 10, wherein an overlapping portion between the adjacent first subblocks is a.

12. The method according to claim 10, wherein the K first subblocks comprise the N submatrices, and when a first subblock of the K first subblocks is $$\begin{bmatrix} a & 0 \\ a & a \end{bmatrix},$$

one submatrix of the N submatrices is located in an upper right corner of the first generator matrix.

13. The method according to claim 10, wherein the K first subblocks comprise the N submatrices, and when a first subblock of the K first subblocks is $$\begin{bmatrix} a & a \\ 0 & a \end{bmatrix},$$

one submatrix of the N submatrices is located in a lower left corner of the first generator matrix.

14. An apparatus, comprising:
a processor and a memory,
wherein the memory is configured to store computer executable instructions, and the processor executes some or all of the computer executable instructions to cause the apparatus to perform operations including:
obtaining a first to-be-encoded vector;
performing first encoding on the first to-be-encoded vector, to obtain a second to-be-encoded vector;
performing second encoding on the second to-be-encoded vector based on a first generator matrix, to obtain an encoded codeword,
wherein the first generator matrix comprises at least N+1 submatrices, N submatrices of the N+1 submatrices are located on a main diagonal of the first generator matrix,
wherein the first generator matrix is a block upper triangular matrix, or the first generator matrix is a block lower triangular matrix, and
wherein each submatrix (a) of the N+1 submatrices is a polar kernel matrix with a size of $2^m * 2^m$, m and N are natural numbers; and
sending the encoded codeword.

15. The apparatus according to claim 14, wherein upper triangular elements in the block upper triangular matrix are all a, and lower triangular elements in the block lower triangular matrix are all a.

16. The apparatus according to claim 14, wherein the first generator matrix comprises K first subblocks, the K first subblocks are located on the main diagonal of the first generator matrix, adjacent first subblocks partially overlap, K is an integer greater than or equal to 2 and greater than or equal to N, and each subblock of the K first subblocks $$\begin{bmatrix} a & 0 \\ a & a \end{bmatrix} \text{ or } \begin{bmatrix} a & a \\ 0 & a \end{bmatrix}.$$

17. The apparatus according to claim 16, wherein an overlapping portion between the adjacent first subblocks is a.

18. The apparatus according to claim 16, wherein the K first subblocks comprise the N submatrices, and when a first subblock of the K first subblocks is $$\begin{bmatrix} a & 0 \\ a & a \end{bmatrix},$$

one submatrix of the N submatrices is located in an upper right corner of the first generator matrix.

19. The apparatus according to claim 16 wherein the K first subblocks comprise the N submatrices, and when a first subblock of the K first subblocks is $$\begin{bmatrix} a & a \\ 0 & a \end{bmatrix},$$

one submatrix of the N submatrices is located in a lower left corner of the first generator matrix.

20. The apparatus according to claim 14, the operations further comprising:
before the obtaining the first to-be-encoded vector:
determining a quantity of second subblocks comprised in a to-be-encoded information bit;
determining, based on an overall code rate of the encoded codeword and the quantity of second subblocks, a corresponding code rate of each second subblock of the second subblocks comprised in the to-be-encoded information bit, wherein the second subblocks have different code rates; and
determining the first to-be-encoded vector based on the corresponding code rate of each second subblock, wherein the first to-be-encoded vector comprises q second subblocks, and q is an integer greater than 0.

* * * * *

UNITED STATES PATENT AND TRADEMARK OFFICE
CERTIFICATE OF CORRECTION

PATENT NO. : 12,143,124 B2
APPLICATION NO. : 18/366757
DATED : November 12, 2024
INVENTOR(S) : Zhang et al.

Page 1 of 1

It is certified that error appears in the above-identified patent and that said Letters Patent is hereby corrected as shown below:

In the Claims

In Column 39, in Claim 16, Line 33, after "first subblocks" insert -- is --.

Signed and Sealed this
Thirty-first Day of December, 2024

Derrick Brent
*Acting Director of the United States Patent and Trademark Office*